(12) United States Patent
Yamamoto et al.

(10) Patent No.: US 8,289,309 B2
(45) Date of Patent: Oct. 16, 2012

(54) INVERTER CIRCUIT AND DISPLAY

(75) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/064,129

(22) Filed: Mar. 8, 2011

(65) Prior Publication Data
US 2011/0242080 A1  Oct. 6, 2011

(30) Foreign Application Priority Data

Mar. 31, 2010  (JP) ................................. 2010-084224

(51) Int. Cl.
G06F 3/038   (2006.01)
H03K 19/094  (2006.01)
(52) U.S. Cl. ......................... 345/211; 326/112
(58) Field of Classification Search .......................... None
See application file for complete search history.

(56) References Cited

U.S. PATENT DOCUMENTS

| | | | | |
|---|---|---|---|---|
| 5,444,273 A * | 8/1995 | Ueno | ............................. | 257/138 |
| 6,194,915 B1 * | 2/2001 | Nakayama et al. | ........... | 326/121 |
| 7,277,071 B2 * | 10/2007 | Oh | ................................ | 345/76 |
| 8,040,297 B2 * | 10/2011 | Chung | ........................... | 345/76 |
| 2007/0091029 A1 * | 4/2007 | Uchino et al. | ................. | 345/76 |
| 2009/0121984 A1 * | 5/2009 | Yamamoto et al. | ............. | 345/76 |

FOREIGN PATENT DOCUMENTS

JP   2008-083272   4/2008

* cited by examiner

*Primary Examiner* — Shawki S Ismail
*Assistant Examiner* — Crystal L Hammond
(74) *Attorney, Agent, or Firm* — Rader Fishman & Grauer, PLLC

(57) ABSTRACT

An inverter circuit includes: a first transistor and a second transistor; a first switch and a second switch; and a first capacity element, in which the first and second transistors are connected in series between a first voltage line and a second voltage line, the first and second switches are connected in series between a supply voltage line and a gate of the second transistor, and are alternately turned on and off so as not to be turned on simultaneously, an end of the first capacity element is connected between the first switch and the second switch, and off-state of the first transistor allows a predetermined fixed voltage to be supplied from the supply voltage line to the gate of the second transistor through the first switch, the end of the first capacity element and the second switch.

13 Claims, 16 Drawing Sheets

US 8,289,309 B2

INVERTER CIRCUIT AND DISPLAY

BACKGROUND OF THE INVENTION

1. Field of the Invention

The present invention relates to an inverter circuit suitably applicable to, for example, a display using organic EL (Electro Luminescence) elements. Moreover, the invention relates to a display including the above-described inverter circuit.

2. Description of the Related Art

In recent years, in the field of displays displaying an image, displays using, as light-emitting elements of pixels, current drive type optical elements of which light emission luminance changes depending on the value of a current flowing therethrough, for example, organic EL elements have been developed for commercialization. Unlike liquid crystal elements or the like, the organic EL elements are self-luminous elements. Therefore, in displays (organic EL displays) using the organic EL elements, color gradation is obtained by controlling the value of a current flowing through the organic EL elements.

As in the case of liquid crystal displays, the organic EL displays are of a simple (passive) matrix system and an active matrix system as a drive system. In the former system, a configuration thereof is simple; however, there is an issue such as difficulty in achieving a large and high-definition display. Therefore, at present, the active matrix system has been increasingly developed. In this system, a current flowing through a light-emitting element arranged in each pixel is controlled by a driving transistor.

In the above-described driving transistor, in some cases, a threshold voltage $V_{th}$ or mobility $\mu$ temporally changes, or the threshold voltage $V_{th}$ or mobility $\mu$ varies from one pixel to another due to variations in a manufacturing process. In the case where the threshold voltage $V_{th}$ or mobility $\mu$ varies from one pixel to another, the value of a current flowing through the driving transistor varies from one pixel to another, so even if the same voltage is applied to gates of the driving transistors, light emission luminance varies from one organic EL element to another, thereby impairing uniformity of a screen. Therefore, as described in Japanese Unexamined Patent Application Publication No. 2008-083272, a display having a function of correcting a change in the threshold voltage $V_{th}$ or mobility $\mu$ has been developed.

Correction of the threshold voltage $V_{th}$ or mobility $\mu$ is performed by a pixel circuit arranged in each pixel. For example, as illustrated in FIG. 19, the pixel circuit includes a driving transistor $Tr_{100}$ controlling a current flowing through an organic EL element 111, a writing transistor $Tr_{200}$ writing a voltage of a signal line DTL to the driving transistor $Tr_{100}$, and a retention capacitor Cs. In other words, the pixel circuit has a 2Tr1C circuit configuration. The driving transistor $Tr_{100}$ and the writing transistor $Tr_{200}$ each are configured of, for example, an n-channel MOS type thin film transistor (TFT).

FIG. 18 illustrates an example of voltage waveforms applied to the pixel circuit and an example of changes in a gate voltage $V_g$ and a source voltage $V_s$ of the driving transistor $Tr_{100}$. A part (A) in FIG. 18 illustrates a state where a signal voltage $V_{sig}$ and an offset voltage $V_{ofs}$ are applied to the signal line DTL. A part (B) in FIG. 18 illustrates a state where a voltage $V_{dd}$ turning the writing transistor $Tr_{200}$ on and a voltage $V_{ss}$ turning the writing transistor $Tr_{200}$ off are applied to a writing line WSL. A part (C) in FIG. 18 illustrates a state where a high voltage $V_{ccH}$ and a low voltage $V_{ccL}$ are applied to a power supply line PSL. Moreover, parts (D) and (E) in FIG. 18 illustrate states where the gate voltage $V_g$ and the source voltage $V_s$ of the driving transistor $Tr_{100}$ are momentarily changed depending on the application of voltages to the power supply line PSL, the signal line DTL and the writing line WSL.

It is obvious from FIG. 18 that a WS pulse P is applied to the writing line WSL twice in a period of 1 H, and threshold correction is performed by a first WS pulse P and mobility correction and signal writing are performed by a second WS pulse P. In other words, in FIG. 18, WS pulses P are used for not only signal writing but also threshold correction and mobility correction of the driving transistor $Tr_{100}$.

SUMMARY OF THE INVENTION

In an active matrix system display, a horizontal drive circuit (not illustrated) driving a signal line DTL or a writing scanning circuit (not illustrated) sequentially selecting pixels 113 is basically configured by including a shift register (not illustrated), and includes buffer circuits (not illustrated) corresponding to rows or columns of the pixels 113, respectively. For example, the buffer circuits in the writing scanning circuit each are configured by connecting two inverter circuits to each other in series. In this case, for example, as illustrated in FIG. 20, the inverter circuits each have a single-channel type circuit configuration in which two n-channel MOS type transistors $Tr_1$ and $Tr_2$ are connected to each other in series. An inverter circuit 200 illustrated in FIG. 20 is inserted between a high-voltage wiring line $L_H$ to which a high-level voltage is applied and a low-voltage wiring line $L_L$ to which a low-level voltage is applied. A gate of the transistor $Tr_2$ on a side close to the high-voltage wiring line $L_H$ is connected to the high-voltage wiring line $L_H$, and a gate of the transistor $Tr_1$ on a side close to the low-voltage wiring line $L_L$ is connected to an input terminal IN. Moreover, a connection point C between the transistor $Tr_1$ and the transistor $Tr_2$ is connected to an output terminal OUT.

In the inverter circuit 200, for example, as illustrated in FIG. 21, when a voltage $V_{in}$ of the input terminal IN is at a voltage $V_{ss}$, a voltage $V_{out}$ of the output terminal OUT is not at a voltage $V_{dd}$ but at a voltage $V_{dd} \cdot V_{th}$. In other words, the voltage $V_{out}$ of the output terminal OUT includes a threshold voltage $V_{th}$ of the transistor $Tr_2$; therefore the voltage $V_{out}$ of the output terminal OUT is greatly affected by variations in the threshold voltage $V_{th}$ of the transistor $Tr_2$.

Therefore, it is considered that, for example, as illustrated in an inverter circuit 300 in FIG. 22, a gate and a drain of the transistor $Tr_2$ are electrically separated from each other, and a high-voltage wiring line $L_{H2}$ to which a higher voltage $V_{dd2}$ ($\geqq V_{dd}+V_{th}$) than the voltage $V_{dd}$ of the drain is applied is connected to the gate. Moreover, for example, a bootstrap type circuit configuration as illustrated in an inverter circuit 400 in FIG. 23 is considered. More specifically, a circuit configuration in which a transistor $Tr_{12}$ is inserted between the gate of the transistor $Tr_{12}$ and the high-voltage wiring line $L_H$ so as to connect a gate of a transistor $Tr_{12}$ to the high-voltage wiring line $L_H$ and a capacity element $C_{10}$ is inserted between a connection point D between the gate of the transistor $Tr_2$ and a source of the transistor $Tr_{12}$ and the connection point C is considered.

However, in any of the circuits in FIGS. 20, 22 and 23, even in the case where the voltage $V_{in}$ of the input terminal IN is high, that is, even in the case where the voltage $V_{out}$ of the output terminal OUT is low, a current (a through current) flows from the high-voltage wiring line $L_H$ to the low-voltage wiring line $L_L$ through the transistors $Tr_1$ and $Tr_2$. As a result, power consumption in the inverter circuits is increased. Moreover, in the circuits in FIGS. 20, 22 and 23, for example, as illustrated in a point encircled by a broken line in a part (B)

in FIG. 21, when the voltage $V_{in}$ of the input terminal IN is at the voltage $V_{dd}$, the voltage $V_{out}$ of the output terminal OUT is not at the voltage $V_{ss}$, and a peak value of the voltage $V_{out}$ of the output terminal OUT varies. As a result, threshold correction or mobility correction in the driving transistor $Tr_{100}$ varies from one pixel circuit 112 to another, thereby causing variations in luminance.

The above-described issues may occur not only in a scanning circuit of the display but also any other devices.

It is desirable to provide an inverter circuit allowed to adjust a peak value of an output voltage to a desired value while reducing power consumption, and a display including the inverter circuit.

According to an embodiment of the invention, there is provided a first inverter circuit including: a first transistor, a second transistor, a third transistor, a fourth transistor and a fifth transistor each having channels of same conduction type; a first capacity element; and an input terminal and an output terminal. In this case, the first transistor makes or breaks electrical connection between the output terminal and a first voltage line in response to a potential difference between a voltage of the input terminal (input voltage) and a voltage of the first voltage line or a potential difference corresponding thereto. The second transistor makes or breaks electrical connection between a second voltage line and the output terminal in response to a potential difference between a voltage of a first terminal which is a source or a drain of the fourth transistor and a voltage of the output terminal or a potential difference corresponding thereto. The third transistor makes or breaks electrical connection between the first terminal and a third voltage line in response to a potential difference between the voltage of the input terminal and a voltage of the third voltage line or a potential difference corresponding thereto. The fourth transistor makes or breaks electrical connection between the first capacity element and a gate of the second transistor in response to a first control signal applied to a gate of the fourth transistor. The fifth transistor makes or breaks electrical connection between the first capacity element and a fourth voltage line in response to a second control signal applied to a gate of the fifth transistor. The first capacity element is inserted between a source or a drain not connected to the fourth voltage line of the fifth transistor and a fifth voltage line.

According to an embodiment of the invention, there is provided a first display with a display section and a drive section, the display section including a plurality of scanning lines arranged in rows, a plurality of signal lines arranged in columns, and a plurality of pixels arranged in a matrix form, the drive section including a plurality of inverter circuits each arranged corresponding to the scanning lines to drive each of the pixels, each of the inverter circuits including the same components as those of the first inverter circuit.

In the first inverter circuit and the first display according to the embodiment of the invention, the third transistor performing an on/off operation in response to a potential difference between the input voltage and the voltage of the third voltage line is arranged between the gate of the second transistor and the third voltage line. Moreover, the first transistor performing an on/off operation in response to a potential difference between the input voltage and the voltage of the first voltage line is arranged between the source of the second transistor and the first voltage line. Therefore, for example, when the input voltage falls, on-resistances of the third transistor and the first transistor are gradually increased to increase time necessary to charge the gate and the source of the second transistor to the voltages of the third voltage line and the first voltage line. Further, for example, when the input voltage rises, the on-resistances of the third transistor and the first transistor are gradually reduced to reduce time necessary to charge the gate and the source of the second transistor to the voltages of the third voltage line and the first voltage line. Moreover, in the embodiment of the invention, for example, when the input voltage falls, the gate of the second transistor is charged to a voltage equal to or higher than an on-voltage of the second transistor. Therefore, for example, when a falling edge voltage is applied to the input terminal, the third transistor and the first transistor are turned off, and immediately after that, the second transistor is turned on, so an output voltage is changed to a voltage of the second voltage line. Further, for example, in the case where the input voltage rises, the third transistor and the first transistor are turned on, and immediately after that, the second transistor is turned off. Therefore, the output voltage is changed to a voltage of the first voltage line.

According to an embodiment of the invention, there is provided a second inverter circuit including: a first transistor, a second transistor, a third transistor, a fourth transistor and a fifth transistor each having channels of same conduction type; a first capacity element; and an input terminal and an output terminal. In this case, a gate of the first transistor is electrically connected to the input terminal, and one terminal of a drain and a source of the first transistor is electrically connected to a first voltage line, and the other terminal of the first transistor is electrically connected to the output terminal. One terminal of a drain and a source of the second transistor is electrically connected to a second voltage line, and the other terminal of the second transistor is electrically connected to the output terminal. A gate of the third transistor is electrically connected to the input terminal, one terminal of a drain and a source of the third transistor is electrically connected to a third voltage line, and the other terminal of the third transistor is electrically connected to a gate of the second transistor. A gate of the fourth transistor is supplied with first control signal, and one terminal of a drain and a source of the fourth transistor is electrically connected to the gate of the second transistor. A gate of the fifth transistor is supplied with a second control signal, one terminal of a drain and a source of the fifth transistor is electrically connected to a fourth voltage line, and the other terminal of the fifth transistor is electrically connected to the other terminal of the fourth transistor. The first capacity element is inserted between the other terminal of the fifth transistor and a fifth voltage line.

According to an embodiment of the invention, there is provided a second display with a display section and a drive section, the display section including a plurality of scanning lines arranged in rows, a plurality of signal lines arranged in columns, and a plurality of pixels arranged in a matrix form, the drive section including a plurality of inverter circuits each arranged corresponding to the scanning lines to drive each of the pixels, each of the inverter circuits including the same components as those of the second inverter circuit.

In the second inverter circuit and the second display according to the embodiment of the invention, the third transistor of which the gate is connected to the input terminal is arranged between the gate of the second transistor and the third voltage line. Moreover, the first transistor of which the gate is connected to the input terminal is arranged between the source of the second transistor and the first voltage line. Therefore, for example, when an input voltage falls, the on-resistances of the third transistor and the first transistor are gradually increased to increase time necessary to charge the gate and the source of the second transistor to the voltages of the third voltage line and the first voltage line. Moreover, for example, when the input voltage rises, the on-resistances of the third transistor and the first transistor are gradually reduced to reduce time necessary to charge the gate and the source of the second transistor to the voltages of the third voltage line and the first voltage line. Further, in the embodiment of the invention, for example, when the input voltage falls, the gate of the second transistor is charged to a voltage equal to or higher than an on-voltage of the second transistor. Therefore, for example, when a falling edge voltage is applied to the input terminal, the third transistor and the first transistor are turned off, and immediately after that, the second transistor is turned on; therefore, the output voltage is changed to a voltage of the second voltage line. Moreover, for example, when the input voltage rises, the third transistor and the first transistor are turned on, and immediately after that, the second transistor is turned off. Therefore, the output voltage is changed to a voltage of the first voltage line.

In the first and second inverter circuits and the first and second displays according to the embodiment of the invention, a second capacity element may be inserted between a gate and a source of the second transistor. In such a case, the capacity of the second capacity element is preferably smaller than the capacity of the first capacity element.

According to an embodiment of the invention, there is provided an inverter circuit including: a first transistor and a second transistor; a first switch and a second switch; and a first capacity element, in which the first and second transistors are connected in series between a first voltage line and a second voltage line, the first and second switches are connected in series between a supply voltage line and a gate of the second transistor, and are alternately turned on and off so as not to be turned on simultaneously, an end of the first capacity element is connected between the first switch and the second switch, and off-state of the first transistor allows a predetermined fixed voltage to be supplied from the supply voltage line to the gate of the second transistor through the first switch, the end of the first capacity element and the second switch.

In the inverter circuits and the displays according to the embodiment of the invention, a period where the first transistor and the second transistor are turned on simultaneously, or a period where the third transistor, the fourth transistor and the fifth transistor are turned on simultaneously is eliminated. Therefore, a current (a through current) hardly flows between voltage lines through these transistors, so power consumption is allowed to be reduced. Moreover, when the input voltage falls, the output voltage is changed to the voltage of the second voltage line or the voltage of the first voltage line, and when the input voltage rises, the output voltage is changed to a voltage opposite to the above-described voltage. Therefore, a shift of a peak value of the output voltage from a desired value is allowed to be reduced. As a result, for example, variations in threshold correction or mobility correction of a driving transistor from one pixel circuit to another are allowed to be reduced, and variations in luminance from one pixel to another are allowed to be reduced.

Other and further objects, features and advantages of the invention will appear more fully from the following description.

DETAILED DESCRIPTION OF THE PREFERRED EMBODIMENTS

A preferred embodiment of the invention will be described in detail below referring to the accompanying drawings. Descriptions will be given in the following order.
1. Embodiment (refer to FIGS. 1 to 11)
2. Modifications (refer to FIGS. 12 to 15)
3. Application Example (refer to FIGS. 16 to 18)
4. Description of related art (refer to FIGS. 19 to 23)

Embodiment

Configuration

Figure 1:
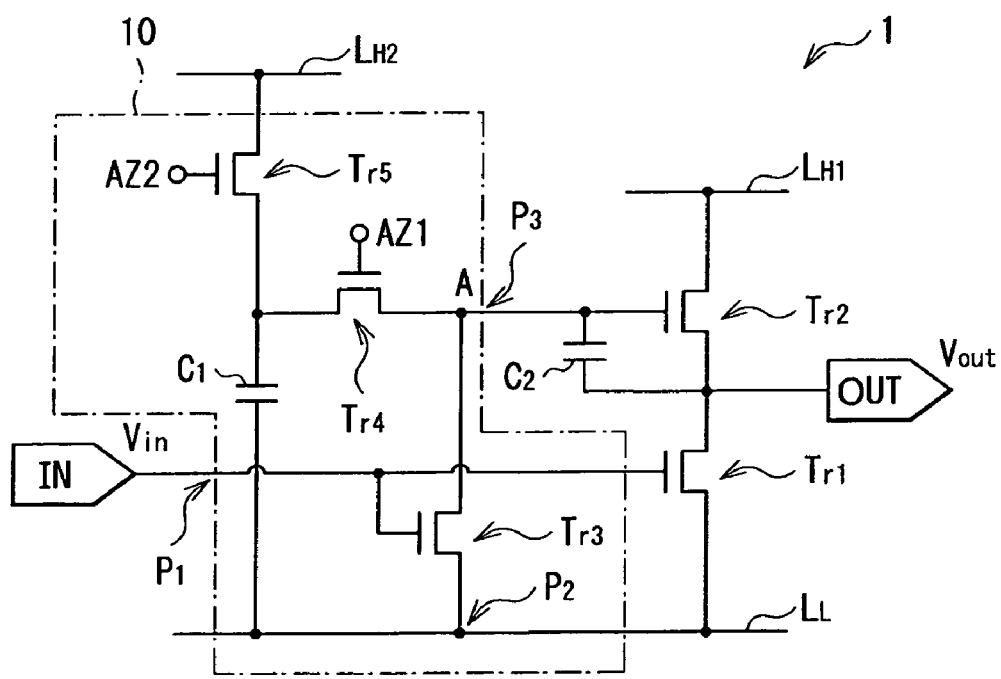
FIG. 1 is a circuit diagram illustrating an example of an inverter circuit according to an embodiment of the invention.

FIG. 1 illustrates an example of a whole configuration of an inverter circuit 1 according to an embodiment of the invention. The inverter circuit 1 outputs, from an output terminal OUT, a pulse signal (for example, refer to a part (B) in FIG. 2) with a substantially inverted signal waveform of a signal waveform (for example, refer to a part (A) in FIG. 2) of a pulse signal applied to an input terminal IN. The inverter circuit 1 is preferably formed on amorphous silicon or amorphous oxide semiconductor, and includes five transistors $Tr_1$ to $Tr_5$ each having channels of same conduction type. In addition to the above-described five transistors $Tr_1$ to $Tr_5$, the inverter circuit 1 includes two capacity elements $C_1$ and $C_2$, the input terminal IN and the output terminal OUT. In other words, the inverter circuit 1 has a 5Tr2C circuit configuration.

The transistors $Tr_1$, $Tr_2$ and $Tr_3$ correspond to specific examples of "a first transistor", "a second transistor" and "a third transistor" in the invention, respectively. Moreover, the transistors $Tr_4$ and $Tr_5$ correspond to specific examples of "a fourth transistor" and "a fifth transistor" in the invention, respectively. Further, the capacity elements $C_1$ and $C_2$ correspond to specific examples of "a first capacity element" and "a second capacity element" in the invention, respectively.

The transistors $Tr_1$ to $Tr_5$ are configured of thin-film transistors (TFTs) each having channels of same conduction type, for example, n-channel MOS (Metal Oxide Semiconductor) type thin-film transistors (TFTs). The transistor $Tr_1$ makes or breaks electrical connection between the output terminal OUT and a low-voltage line $L_L$ in response to, for example, a potential difference $V_{gs1}$ between a voltage (an input voltage $V_{in}$) of the input terminal IN and a voltage $V_L$ of the low-voltage line $L_L$ (or a potential difference corresponding thereto). A gate of the transistor $Tr_1$ is electrically connected to the input terminal IN, and one terminal of a source and a drain of the transistor $Tr_1$ is electrically connected to the low-voltage line $L_L$, and the other terminal not connected to the low-voltage line $L_L$ of the transistor $Tr_1$ is electrically connected to the output terminal OUT. The transistor $Tr_2$ makes or breaks electrical connection between a high-voltage line $L_{H1}$ and the output terminal OUT in response to a potential difference $V_{gs2}$ between a voltage $V_{s3}$ of one terminal (a terminal A) which is not connected to the low-voltage line $L_L$ of a source and a drain of the transistor $Tr_3$ and a voltage (an output voltage $V_{out}$) of the output terminal OUT (or a potential difference corresponding thereto). A gate of the transistor $Tr_2$ is electrically connected to the terminal A of the transistor $Tr_3$. One terminal of a source and a drain of the transistor $Tr_2$ is electrically connected to the output terminal OUT, and the other terminal not connected to the output terminal OUT of the transistor $Tr_2$ is electrically connected to a high-voltage line $L_{H1}$.

The transistor $Tr_3$ makes or breaks electrical connection between the gate of the transistor $Tr_2$ and the low-voltage line $L_L$ in response to a potential difference $V_{gs3}$ between the input voltage $V_{in}$ and the voltage $V_L$ of the low-voltage line $L_L$ (or a potential difference corresponding thereto). A gate of the transistor $Tr_3$ is electrically connected to the input terminal IN. The other terminal of the source and the drain of the transistor $Tr_3$ is electrically connected to the low-voltage line $L_L$, and the terminal A of the transistor $Tr_3$ is electrically connected to the gate of the transistor $Tr_2$. In other words, the transistors $Tr_1$ and $Tr_3$ are connected to the same voltage line (the low-voltage line $L_L$). Therefore, a terminal on a side close to the low-voltage line $L_L$ of the transistor $Tr_1$ and a terminal on a side close to the low-voltage line $L_L$ of the transistor $Tr_3$ have the same potential. The transistor $Tr_4$ makes or breaks electrical connection between the capacity element $C_1$ and the gate of the transistor $Tr_2$ in response to a control signal applied to a control terminal AZ1. A gate of the transistor $Tr_4$ is electrically connected to the control terminal AZ1. One terminal of a source and a drain of the transistor $Tr_4$ is electrically connected to the capacity element $C_1$, and the other terminal not connected to the capacity element $C_1$ of the transistor $Tr_4$ is electrically connected to the gate of the transistor $Tr_2$. The transistor $Tr_5$ makes and breaks electrical connection between a high-voltage line $L_{H2}$ and the capacity element $C_1$ in response to a control signal applied to a control terminal AZ2. A gate of the transistor $Tr_5$ is electrically connected to the control terminal AZ2. One terminal of a source and a drain of the transistor $Tr_5$ is electrically connected to the high-voltage line $L_{H2}$. The other terminal not connected to the high-voltage line $L_{H2}$ of the transistor $Tr_5$ is electrically connected to the capacity element $C_1$.

The low-voltage line $L_L$ corresponds to a specific example of "a first voltage line" and "a third voltage line" in the invention. The high-voltage line $L_{H1}$ and the high-voltage line $L_{H2}$ correspond to specific examples of "a second voltage line" and "a fourth voltage line" in the invention, respectively.

The high-voltage lines $L_{H1}$ and $L_{H2}$ are connected to a power supply (not illustrated) outputting a higher voltage (a constant voltage) than the voltage $V_L$ of the low-voltage line $L_L$. A voltage $V_{H1}$ of the high-voltage line $L_{H1}$ is at a voltage $V_{dd1}$ during the drive of the inverter circuit 1, and a voltage $V_{H2}$ of the high-voltage line $L_{H2}$ is at a voltage $V_{dd2}$ ($\geq V_{dd1} + V_{th2}$) during the drive of the inverter circuit 1. Note that a voltage $V_{th2}$ is a threshold voltage of the transistor $Tr_2$. On the other hand, the low-voltage line $L_L$ is connected to a power supply (not illustrated) outputting a lower voltage (a constant voltage) than the voltage $V_{H1}$ of the high-voltage line $L_{H1}$, and the voltage $V_L$ of the low-voltage line $L_L$ is at a voltage $V_{ss}$ (<$V_{dd1}$) during the drive of the inverter circuit 1.

The control terminal AZ1 is connected to a power supply $S_1$ (not illustrated) outputting a predetermined pulse signal. The control terminal AZ2 is connected to a power supply $S_2$ (not illustrated) outputting a predetermined pulse signal. For example, as illustrated in a part (C) in FIG. 2, the power supply $S_1$ outputs a high while a low is applied to the control terminal AZ2. On the other hand, as illustrated in a part (B) in FIG. 2, the power supply $S_2$ outputs a high while a low is applied to the control terminal AZ1. In other words, the power supply $S_1$ and the power supply $S_2$ alternately outputs a high so as to prevent the transistors $Tr_4$ and $Tr_5$ from being turned on simultaneously (that is, to alternately turn the transistors $Tr_4$ and $Tr_5$ on and off). The power supply $S_1$ switches the output voltage thereof from low to high (that is, the power supply $S_1$ turns the transistor $Tr_4$ on) at a different timing from a falling edge of the input voltage $V_{in}$. The power supply $S_1$ switches the output voltage thereof from low to high, for example, immediately before the falling edge of the input voltage $V_{in}$.

The capacity element $C_1$ is inserted between the source or the drain which is not connected to the high-voltage line $L_{H2}$ of the transistor $Tr_5$ and the low-voltage line $L_L$. The capacity element $C_2$ is inserted between the gate of the transistor $Tr_2$ and the source of the transistor $Tr_2$. The capacities of the capacity elements $C_1$ and $C_2$ are sufficiently larger than parasitic capacitances of the transistors $Tr_1$ to $Tr_5$. The capacity of the capacity element $C_2$ is smaller than the capacity of the capacity element $C_1$. The capacity of the capacity element $C_1$ has a value allowed to charge the gate of the transistor $Tr_2$ to a voltage $V_{ss}+V_{th2}$ or over when a falling edge voltage is applied to the input terminal IN and the transistor $Tr_3$ is turned off. Note that a voltage $V_{th2}$ is a threshold voltage of the transistor $Tr_2$. The capacities of the capacity elements $C_1$ and $C_2$ each preferably satisfy the following Mathematical Expression 1. In the case where the capacity elements $C_1$ and $C_2$ have a sufficiently smaller value than a parasitic capacitance $C_{out}$ (not illustrated) generated between the output terminal OUT and the low-voltage line $L_L$, if the capacities of the capacity elements $C_1$ and $C_2$ satisfy Mathematical Expression 1, at a falling edge of the input voltage $V_{in}$ which will be described later, the transistor $Tr_4$ is on, and allows a gate-source voltage of the transistor $Tr_2$ to reach the threshold voltage $V_{th2}$ or over of the transistor $Tr_2$, and allows the output voltage $V_{out}$ to be switched from low to high.

$$C_1(V_{dd2}-V_{ss})/(C_1+C_2) > V_{th2} \qquad \text{Mathematical Expression 1}$$

The inverter circuit 1 corresponds to an inverter circuit (an inverter circuit 200 in FIG. 20) in related art further including a control element 10 and the capacity element $C_2$ which are inserted between the transistors $T_{r1}$ and $T_{r2}$ in an output stage and the input terminal IN. In this case, for example, as illustrated in FIG. 1, the control element 10 includes a terminal $P_1$ electrically connected to the input terminal IN, a terminal $P_2$ electrically connected to the low-voltage line $L_L$, a terminal $P_3$ electrically connected to the gate of the transistor $Tr_2$, and a terminal $P_4$ electrically connected to the high-voltage line $L_{H2}$. Moreover, for example, as illustrated in FIG. 1, the control element 10 includes the transistors $Tr_3$ to $Tr_5$ and the capacity element $C_1$.

For example, when a falling edge voltage is applied to the terminal $P_1$, the control element 10 charges the gate of the transistor $Tr_2$ electrically connected to the terminal $P_3$ to the voltage $V_{ss}+V_{th2}$ or over. Moreover, for example, when a rising edge voltage is applied to the terminal $P_1$, the control element 10 reduces the gate voltage $V_{g2}$ of the transistor $Tr_2$ electrically connected to the terminal $P_3$ to a voltage smaller than the voltage $V_{ss}+V_{th2}$. Note that the operation of the control element 10 will be described with the following description of the operation of the inverter circuit 1.

Operation

Figure 3:
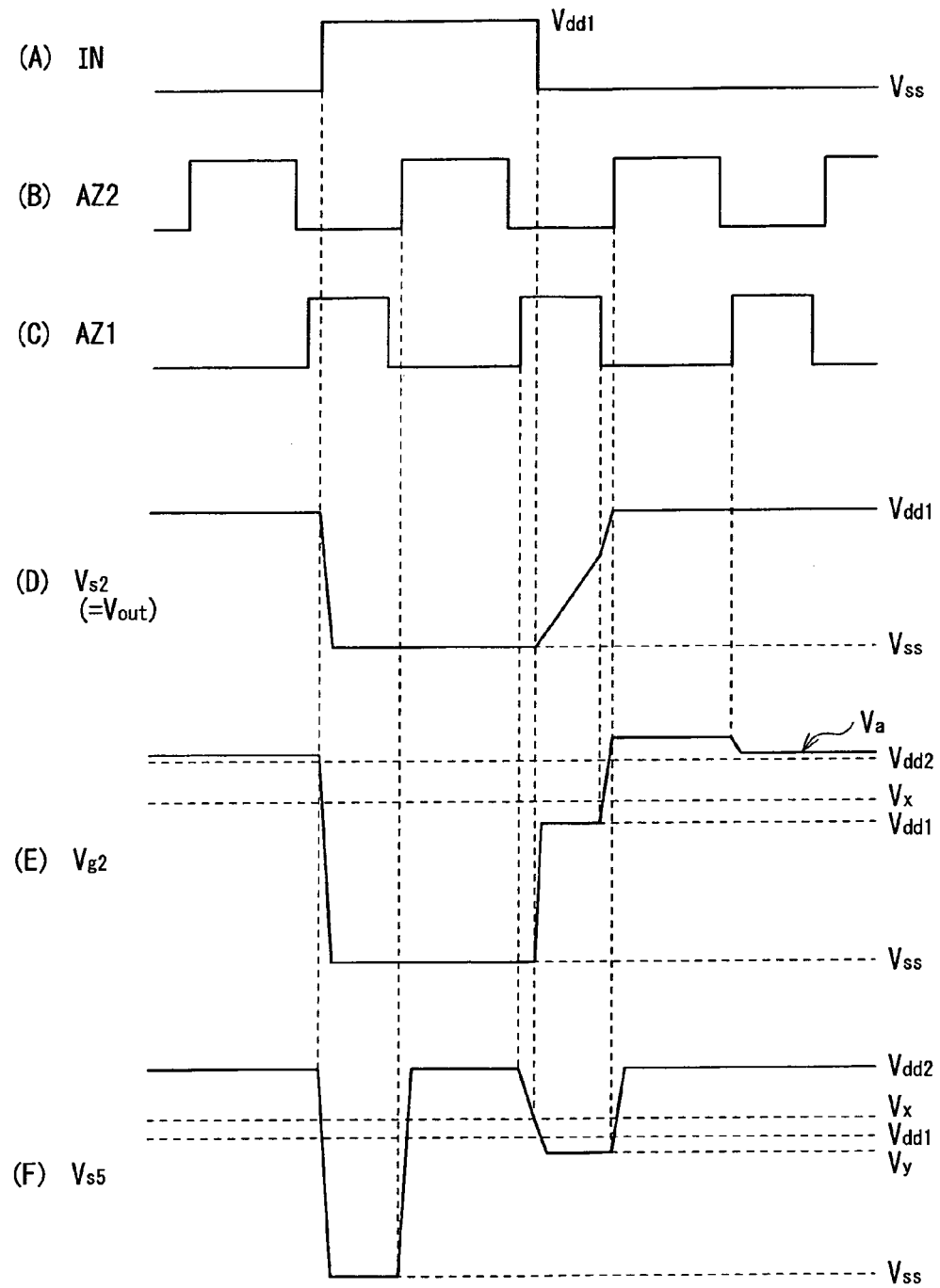
FIG. 3 is a waveform chart illustrating an example of an operation of the inverter circuit in FIG. 1.

Next, an example of the operation of the inverter circuit 1 will be described below referring to FIGS. 3 to 11. FIG. 3 is a waveform chart illustrating an example of the operation of the inverter circuit 1. FIGS. 4 to 11 are circuit diagrams sequentially illustrating an example of the operation of the inverter circuit 1.

Figure 4:
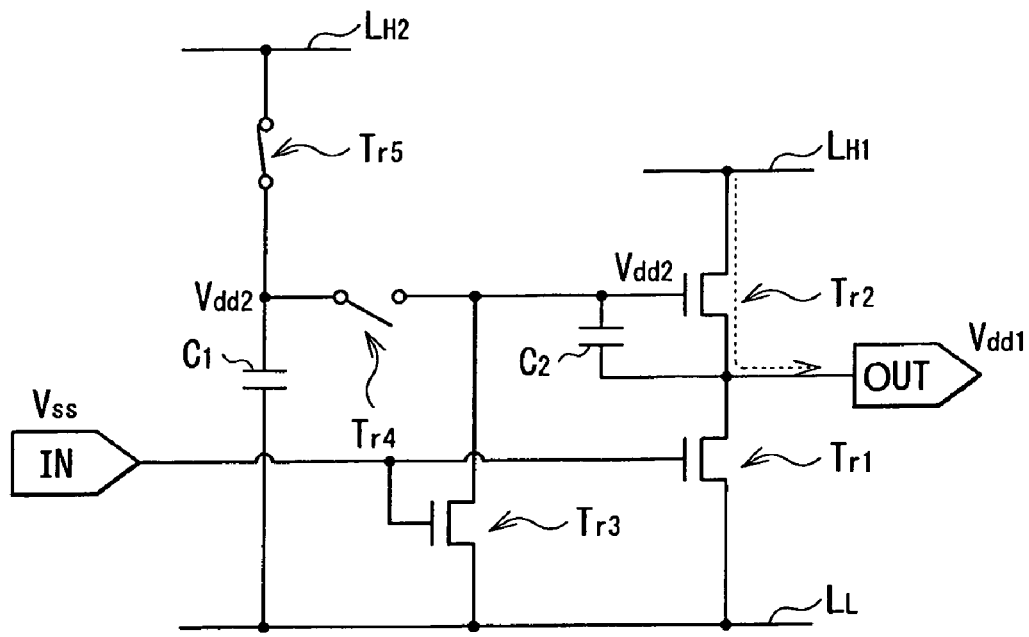
FIG. 4 is a circuit diagram for describing an example of an operation of the inverter circuit in FIG. 1.

First, as illustrated in FIG. 4, the input voltage $V_{in}$ is low ($V_{ss}$), and the transistor $Tr_5$ is turned on, and the transistor $Tr_4$ is turned off. At this time, the transistors $Tr_1$ and $Tr_3$ are off, and the capacity element $C_1$ is charged to the voltage $V_{dd2}$, and a source voltage $V_{s5}$ of the transistor $Tr_5$ is at the voltage $V_{dd2}$. Moreover, the gate voltage $V_{g2}$ of the transistor $Tr_2$ is also at the voltage $V_{dd2}$, and the transistor $Tr_2$ is on. Therefore, at this time, the voltage $V_{dd1}$ as the output voltage $V_{out}$ is transmitted to the output terminal OUT.

Figure 5:
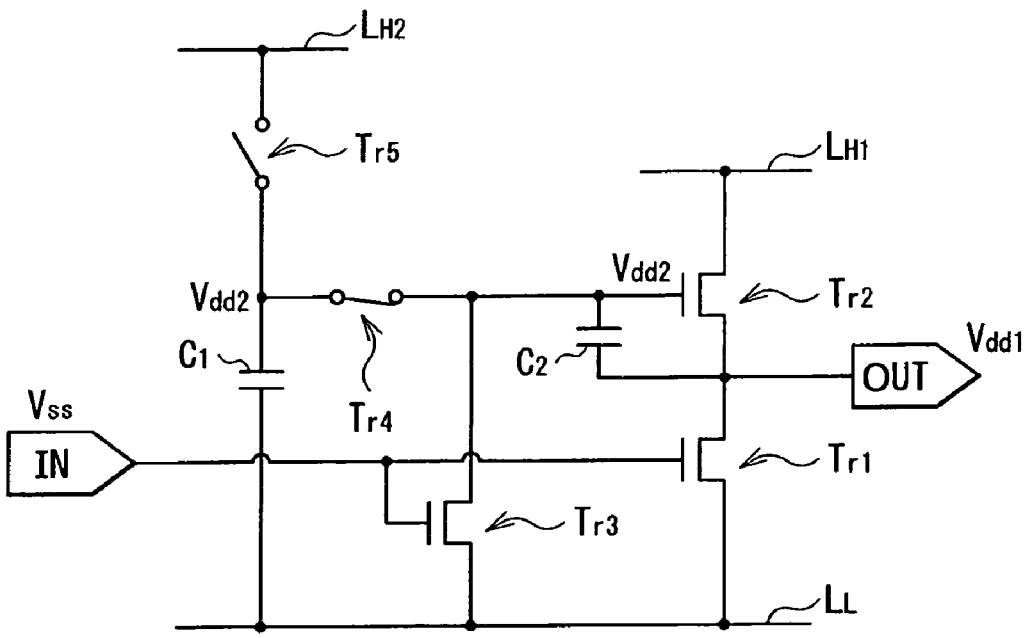
FIG. 5 is a circuit diagram for describing an example of an operation following FIG. 4.
Figure 6:
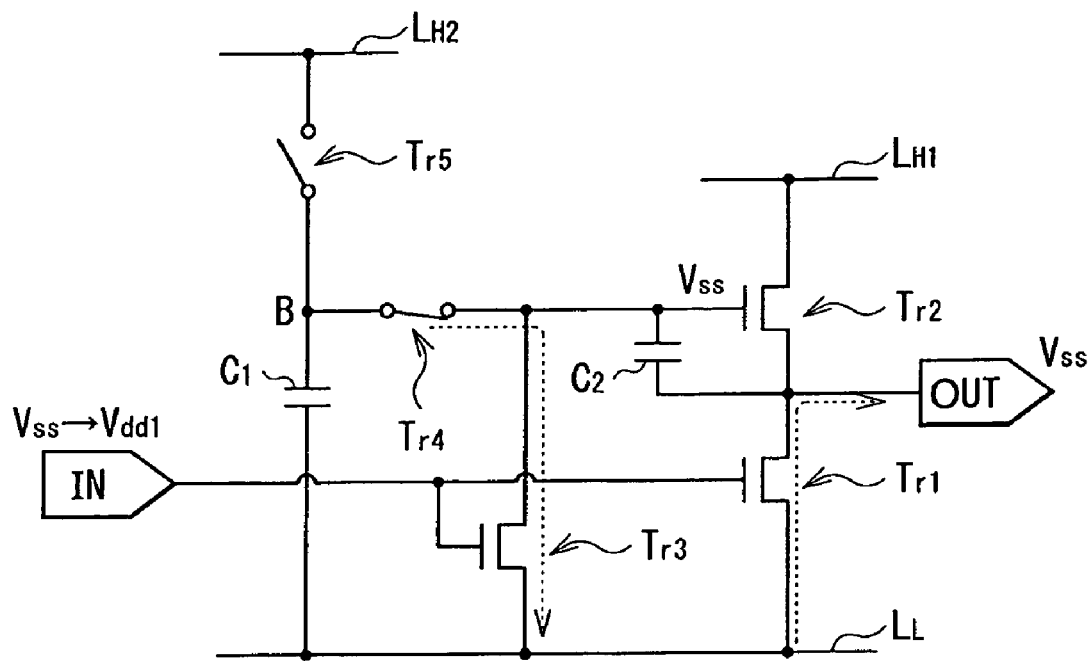
FIG. 6 is a circuit diagram for describing an example of an operation following FIG. 5.

Next, as illustrated in FIG. 5, in a state where the input voltage $V_{in}$ is low ($V_{ss}$), the transistor $Tr_5$ is turned off, and then the transistor $Tr_4$ is turned on. In other words, before the input voltage $V_{in}$ is switched from low ($V_{ss}$) to high ($V_{dd1}$), the transistor $Tr_4$ is turned on. The gate voltage $V_{g2}$ of the transistor $Tr_2$ is at the voltage $V_{dd2}$ before the transistor $Tr_4$ is turned on. Therefore, even if the transistor $Tr_4$ is switched from off to on, the transistor $Tr_2$ is kept on, and the output voltage $V_{out}$ is kept at the voltage $V_{dd1}$.

Next, in a state where the input voltage $V_{in}$ is low ($V_{ss}$), the transistor $Tr_4$ is turned off, and then the transistor $Tr_5$ is turned on. Likewise, the transistor $Tr_4$ and $Tr_5$ are repeatedly turned on and off, and then when the transistor $Tr_4$ is on (the transistor $Tr_5$ is off), the input voltage $V_{in}$ is switched from low ($V_{ss}$) to high ($V_{dd1}$) (refer to FIG. 6). Then, the transistors $Tr_1$ and $Tr_3$ are turned on, and the gate and the source of the transistor $Tr_2$ are charged to the voltage $V_L$ ($=V_{ss}$) of the low-voltage line $L_L$. Therefore, the transistor $Tr_2$ is turned off, and the voltage $V_{ss}$ as the output voltage $V_{out}$ is transmitted to the output terminal OUT. Moreover, when the transistor $Tr_4$ is turned on, the capacity element $C_1$ charged to the voltage $V_{dd2}$ is connected to the low-voltage line $L_L$ through the transistor $Tr_4$. Thus, the voltage of a terminal (a terminal B) on a side close to the transistor $Tr_5$ of the capacity element $C_1$ is gradually reduced from the voltage $V_{dd2}$, eventually to the voltage $V_{ss}$.

After that, in a state where the input voltage $V_{in}$ is high ($V_{dd1}$), the transistor $Tr_4$ is turned off, and then the transistor $Tr_5$ is turned on. Likewise, the transistors $Tr_4$ and $Tr_5$ are repeatedly turned on and off, and then when transistor $Tr_4$ is on (the transistor $Tr_5$ is off), the input voltage $V_{in}$ is switched from high ($V_{dd1}$) to low ($V_{ss}$). Then, the transistors $Tr_1$ and $Tr_3$ are turned off.

Figure 7:
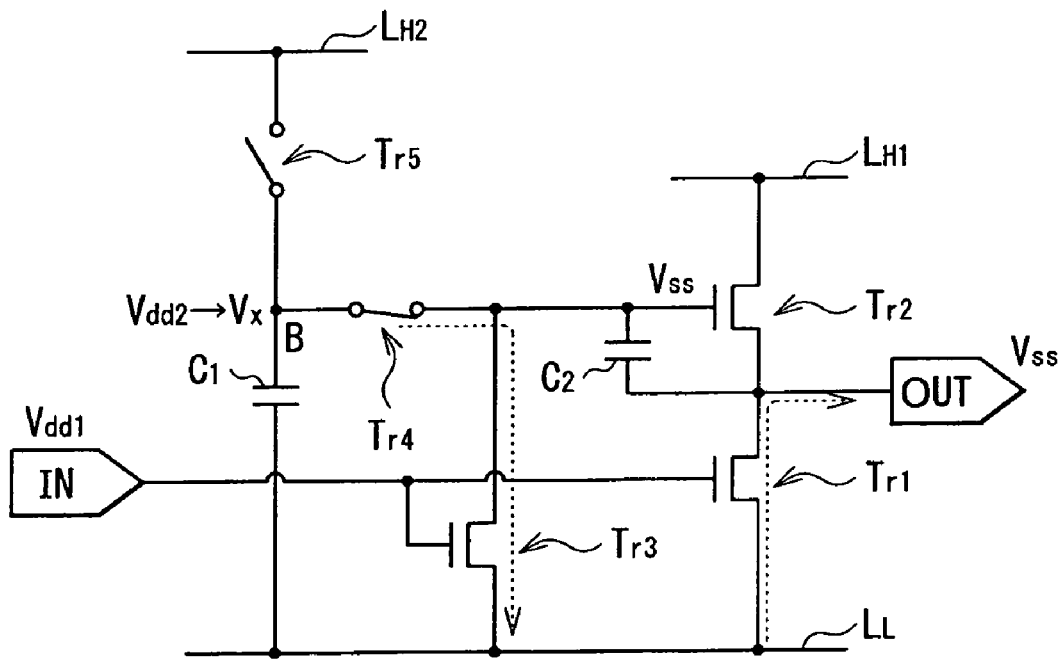
FIG. 7 is a circuit diagram for describing an example of an operation following FIG. 6.

In this case, when the transistor $Tr_4$ is turned on, as described above, the voltage of the capacity element $C_1$ (a voltage of the terminal B) is gradually reduced from the voltage $V_{dd2}$ (refer to FIG. 7). Note that a voltage $V_x$ in FIG. 7 is the voltage of the capacity element $C_1$ (the voltage of the terminal B) immediately before the input voltage $V_{in}$ is switched from high ($V_{dd1}$) to low ($V_{ss}$). After that, after the transistor $Tr_4$ is turned on, the input voltage $V_{in}$ is switched from high ($V_{dd1}$) to low ($V_{ss}$) to turn the transistor $Tr_3$ off (refer to FIG. 8). At this time, the capacity element $C_1$ is connected to the gate of the transistor $Tr_2$ through the transistor $Tr_4$; therefore, the capacity element $C_1$ charges the gate of the transistor $Tr_2$. As a result, the voltage of the capacity element $C_1$ and the gate voltage $V_{g2}$ of the transistor $Tr_2$ are switched to a voltage $V_y$.

Figure 8:
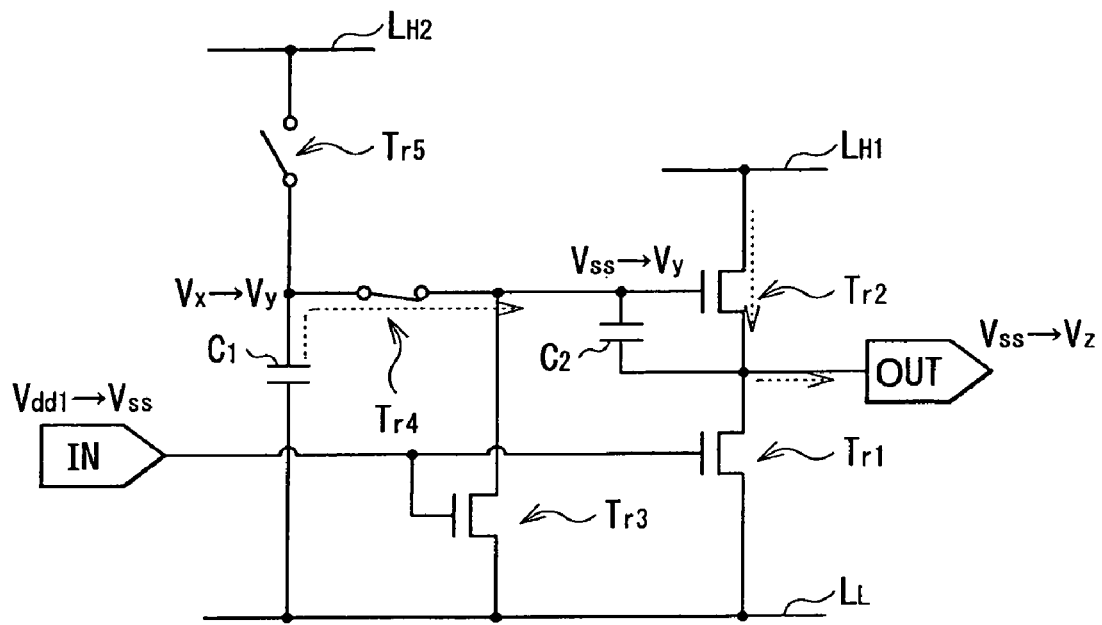
FIG. 8 is a circuit diagram for describing an example of an operation following FIG. 7.
Figure 9:
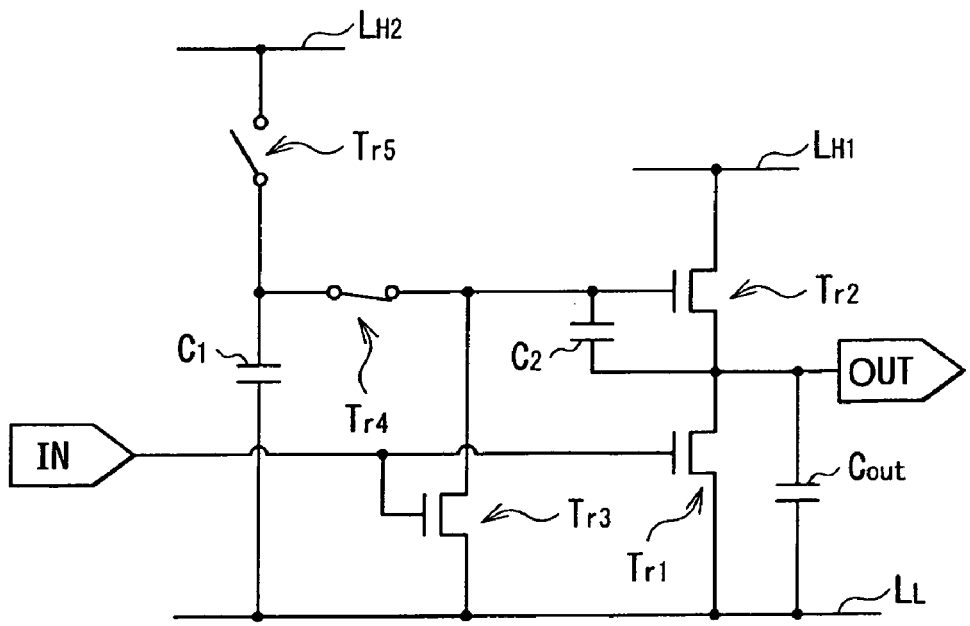
FIG. 9 is a circuit diagram for describing an example of an operation following FIG. 8.
Figure 10:
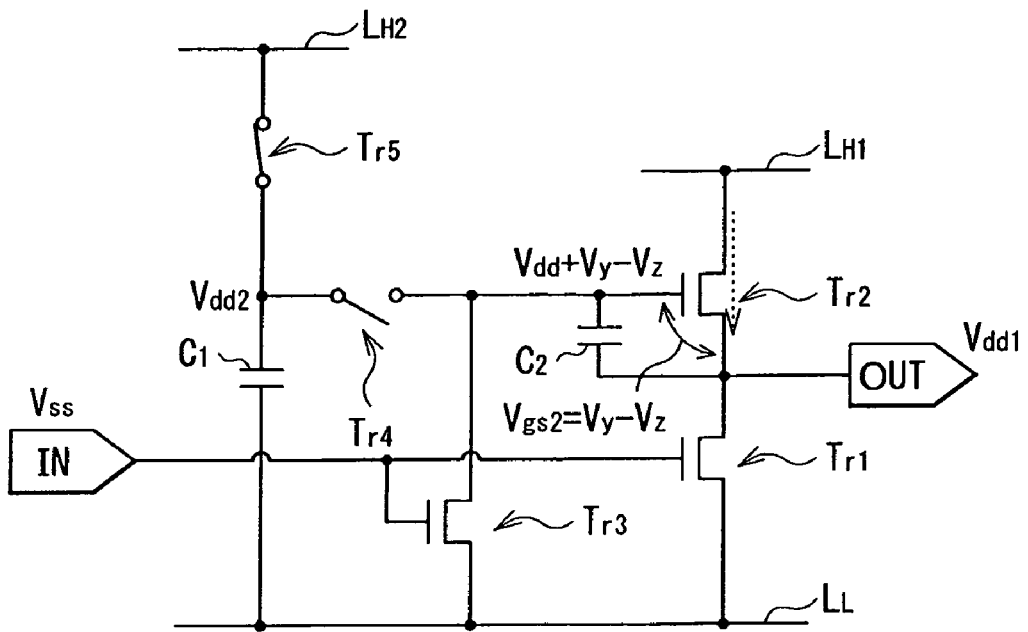
FIG. 10 is a circuit diagram for describing an example of an operation following FIG. 9.
Figure 11:
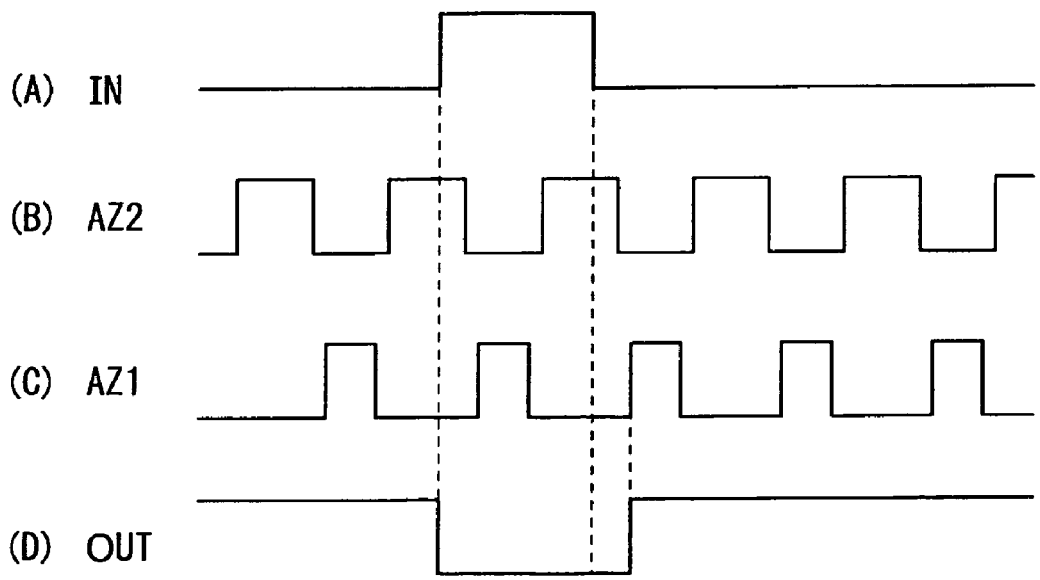
FIG. 11 is a circuit diagram for describing an example of an operation following FIG. 10.

At this time, in the case where the voltage $V_y$ is equal to or higher than the sum of the voltage ($=V_{ss}$) of the low-voltage line $L_L$ and the threshold voltage $V_{th2}$ of the transistor $Tr_2$, the transistor $Tr_2$ is turned on, and a current flows through the transistor $Tr_2$ to gradually increase the output voltage $V_{out}$ (refer to FIG. 8). After the lapse of a certain period, the output voltage $V_{out}$ is changed to a voltage Vz. The capacity element $C_2$ is connected between the gate and the source of the transistor $Tr_2$. Therefore, by a bootstrap operation by the capacity element $C_2$, the gate voltage $V_{g2}$ of the transistor $Tr_2$ is intended to change with a change in the source voltage $V_{s2}$ of the transistor $Tr_2$. However, as the transistor $Tr_4$ is on and the capacity element $C_1$ is connected to the transistor $Tr_2$, the gate voltage $V_{g2}$ of the transistor $Tr_2$ is substantially at the voltage $V_y$.

The voltage $V_y$ will be considered below. In the case where the parasitic capacitances of the transistors $Tr_1$ to $Tr_5$ are as small as a negligible amount, compared to the capacity elements $C_1$ and $C_2$, and the parasitic capacitance $C_{out}$ of the output terminal OUT (refer to FIG. 9) is extremely larger than the capacity element $C_2$, the voltage $V_y$ is represented by an expression (1) with use of the voltage $V_x$.

$$V_y = C_1(V_x - V_{ss})/(C_1 + C_2) + V_{ss} \qquad (1)$$

It is obvious from the expression (1) that the voltage $V_y$ is determined by the capacities of the capacity elements $C_1$ and $C_2$, and when the capacity of the capacity element $C_1$ is large, the voltage $V_y$ is substantially equal to the voltage $V_x$.

After the input voltage $V_{in}$ is switched from high ($V_{dd1}$) to low ($V_{ss}$), the transistor $Tr_4$ is turned off. At this time, when the gate-source voltage $V_{gs2}$ of the transistor $Tr_2$ is equal to or higher than the threshold voltage $V_{th2}$ of the transistor $Tr_2$ ($V_y - V_z > V_{th2}$), the transistor $Tr_2$ is turned on, and the source voltage $V_{s2}$ of the transistor $Tr_2$ keeps increasing (refer to FIG. 10). When the source voltage $V_{s2}$ of the transistor $Tr_2$ increases, the transistor $Tr_4$ is turned off, so the gate of the transistor $Tr_2$ and the capacity element $C_1$ are separated from each other. Therefore, the gate voltage $V_{g2}$ of the transistor $Tr_2$ changes with a change in the source voltage $V_{s2}$ of the transistor $Tr_2$ by a bootstrap operation by the capacity element $C_2$. After the lapse of a certain period, the voltage $V_{dd1}$ as the output voltage $V_{out}$ is transmitted to the output terminal OUT.

After the transistor $Tr_4$ is turned off, the transistor $Tr_5$ is turned on again. Therefore, the capacity element $C_1$ is charged to the voltage $V_{dd2}$.

After the transistor $Tr_5$ is turned off, the transistor $Tr_4$ is turned on again (refer to FIG. 11). Therefore, capacity coupling occurs again, and the capacity element $C_1$ charges the gate of the transistor $Tr_2$. As a result, the voltages of the capacity element $C_1$ and the gate of the transistor $Tr_2$ are equal to each other. In the case where the gate voltage $V_{g2}$ of the transistor $Tr_2$ at this time is at a voltage $V_a$, the gate-source voltage $V_{gs2}$ of the transistor $Tr_2$ is changed to a voltage $V_a - V_{dd1}$, and the transistor $Tr_4$ is turned off. When such an operation is repeated, the gate voltage $V_{g2}$ of the transistor $Tr_2$ is changed to the voltage $V_{dd2}$. Therefore, the voltage $V_{dd1}$ as the output voltage $V_{out}$ is transmitted to the output terminal OUT.

Figure 2:
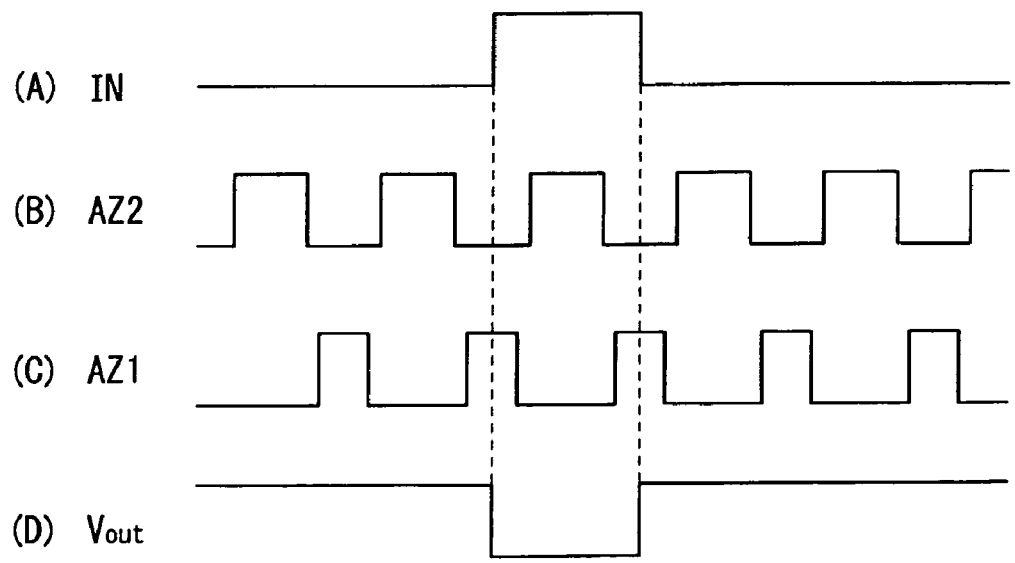
FIG. 2 is a waveform chart illustrating an example of input/output signal waveforms of the inverter circuit in FIG. 1.

Thus, in the inverter circuit 1 according to the embodiment, the output terminal OUT outputs a pulse signal (for example, refer to the part (B) in FIG. 2) with a substantially inverted waveform of the waveform (for example, refer to the part (A) in FIG. 2) of a pulse signal applied to the input terminal IN.

Effects

Figure 20:
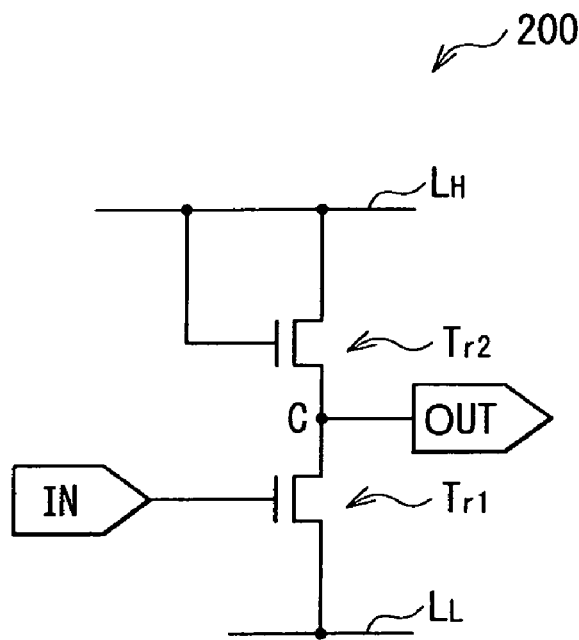
FIG. 20 is a circuit diagram illustrating an example of an inverter circuit in related art.
Figure 21:
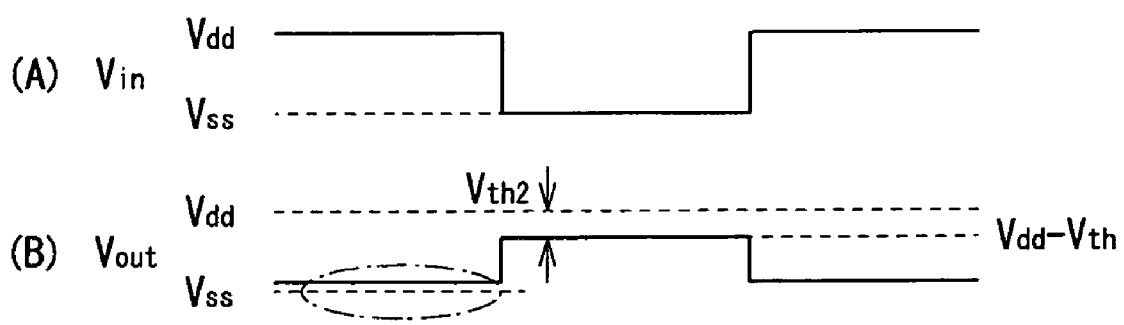
FIG. 21 is a waveform chart illustrating an example of input/output signal waveforms of the inverter circuit in FIG. 20.

The inverter circuit 200 in related art illustrated in FIG. 20 has, for example, a single channel type circuit configuration in which two n-channel MOS type transistors $Tr_1$ and $Tr_2$ are connected to each other in series. In the inverter circuit 200, for example, as illustrated in FIG. 21, when the input voltage $V_{in}$ is at the voltage $V_{ss}$, the output voltage $V_{out}$ is not at the voltage $V_{dd}$ but at a voltage $V_{dd} - V_{th2}$. In other words, the output voltage $V_{out}$ includes the threshold voltage $V_{th2}$ of the transistor $Tr_2$, and the output voltage $V_{out}$ is greatly affected by variations in the threshold voltage $V_{th2}$ of the transistor $Tr_2$.

Figure 22:
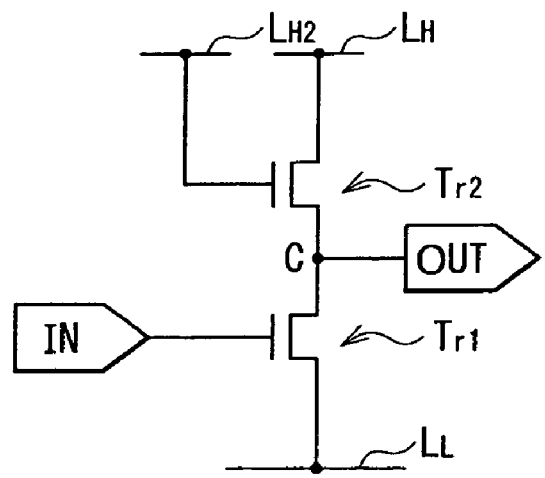
FIG. 22 is a circuit diagram illustrating another example of an inverter circuit in related art.

Therefore, it is considered that, for example, as illustrated in an inverter circuit 300 in FIG. 22, the gate and the drain of the transistor $Tr_2$ are electrically separated from each other, and the gate is connected to the high-voltage wiring line $L_{H2}$ to which a higher voltage $V_{dd2}$ ($=V_{dd}+V_{th2}$) than the voltage $V_{dd}$ of the drain is applied. Moreover, for example, a bootstrap type circuit configuration represented by an inverter circuit 400 in FIG. 23 is considered.

Figure 23:
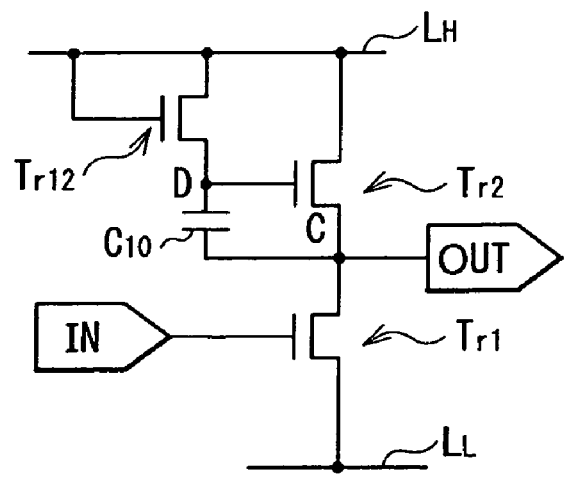
FIG. 23 is a circuit diagram illustrating still another example of an inverter circuit in related art.

However, in any of the circuits in FIGS. 20, 22 and 23, even in the case where the input voltage $V_{in}$ is high, that is, even in the case where the output voltage $V_{out}$ is low, a current (a through current) flows from the high-voltage wiring line $L_H$ to the low-voltage wiring line $L_L$ through the transistors $Tr_1$ and $Tr_2$. As a result, power consumption in the inverter circuits is increased. Moreover, in the circuits in FIGS. 20, 22 and 23, for example, as illustrated in a point encircled by a broken line in a part (B) in FIG. 21, when the input voltage $V_{in}$ is at the voltage $V_{dd}$, the output voltage $V_{out}$ is not at the voltage $V_{ss}$, and a peak value of the output voltage $V_{out}$ varies. Therefore, for example, in the case where the inverter circuits are used in a scanner in an active matrix organic EL display, threshold correction or mobility correction in the driving transistor varies from one pixel circuit to another, thereby causing variations in luminance.

On the other hand, in the inverter circuit 1 according to the embodiment, the transistors $Tr_1$ and $Tr_3$ performing an ON/OFF operation in response to a potential difference between the input voltage Vin and the voltage $V_L$ of the low-voltage line $L_L$ are arranged between the gate of the transistor $Tr_2$ and the low-voltage line $L_L$ and between the source of the transistor $Tr_2$ and the low-voltage line $L_L$. Therefore, when the gate voltages of the transistors $Tr_1$ and $Tr_3$ are switched (reduced) from high ($V_{dd1}$) to low ($V_{ss}$), on-resistances of the transistors $Tr_1$ and $Tr_3$ are gradually increased to increase time necessary to charge the gate and the source of the transistor $Tr_2$ to the voltage $V_L$ of the low-voltage line $L_L$. Moreover, when the gate voltages of the transistors $Tr_1$ and $Tr_3$ are switched (increased) from low ($V_{ss}$) to high ($V_{dd1}$), the on-resistances of the transistors $Tr_1$ and $Tr_3$ are gradually reduced to reduce time necessary to charge the gate and the source of the transistor $Tr_2$ to the voltage $V_L$ of the low-voltage line $L_L$. Further, in the inverter circuit 1 according to the embodiment, the capacity element $C_1$ is connected to the source of the transistor $Tr_5$, and is connected to the gate of the transistor $Tr_2$ through the transistor $Tr_4$. Therefore, when a rising edge voltage is applied to the input terminal IN to turn the transistors $Tr_1$ and $Tr_3$ off, the gate of the transistor $Tr_2$ is charged to a voltage equal to or higher than the voltage $V_{ss} + V_{th2}$ by the capacity element C1 to which the voltage $V_{dd2}$ is charged. As a result, the transistor $Tr_2$ is turned on, and the output voltage $V_{out}$ is changed to the voltage ($V_{dd1}$) of the high-voltage line $L_{H1}$.

Thus, in the inverter circuit 1 according to the embodiment, a period where the transistor $Tr_1$ and the transistor $Tr_2$ are simultaneously turned on or a period where the transistors $Tr_1$ to $Tr_5$ are simultaneously turned on is eliminated. Therefore, a current (a through current) hardly flows between the high-voltage line $V_{H1}$ and the low-voltage line $L_L$ and between the high-voltage line $V_{H2}$ and the low-voltage line $L_L$ through the transistors $Tr_1$ and $Tr_2$ or through the transistors $Tr_3$ to $Tr_5$. As a result, power consumption is allowed to be reduced. Moreover, when the input voltage $V_{in}$ is switched (reduced) from high ($V_{dd1}$) to low ($V_{ss}$), the output voltage $V_{out}$ is changed to a voltage of the high-voltage line $V_{H1}$, and when the input voltage $V_{in}$ is switched (increased) from low ($V_{ss}$) to high ($V_{dd1}$), the output voltage $V_{out}$ is changed to a voltage of the low-voltage line $L_L$. Therefore, variations in the output voltage $V_{out}$ are allowed to be eliminated. As a result, for example, variations in threshold correction or mobility correction in the driving transistor from one pixel circuit to another are allowed to be reduced, and variations in luminance from one pixel to another are allowed to be reduced.

Modifications

Figure 12:
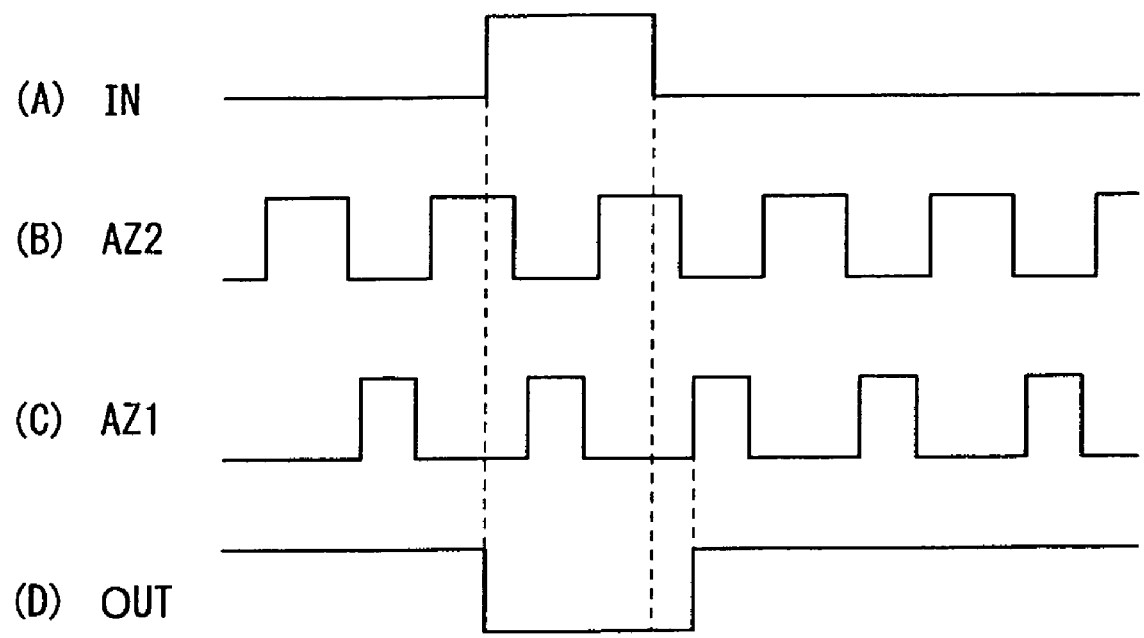
FIG. 12 is a waveform chart illustrating another example of input/output signal waveforms of the inverter circuit in FIG. 1.
Figure 13:
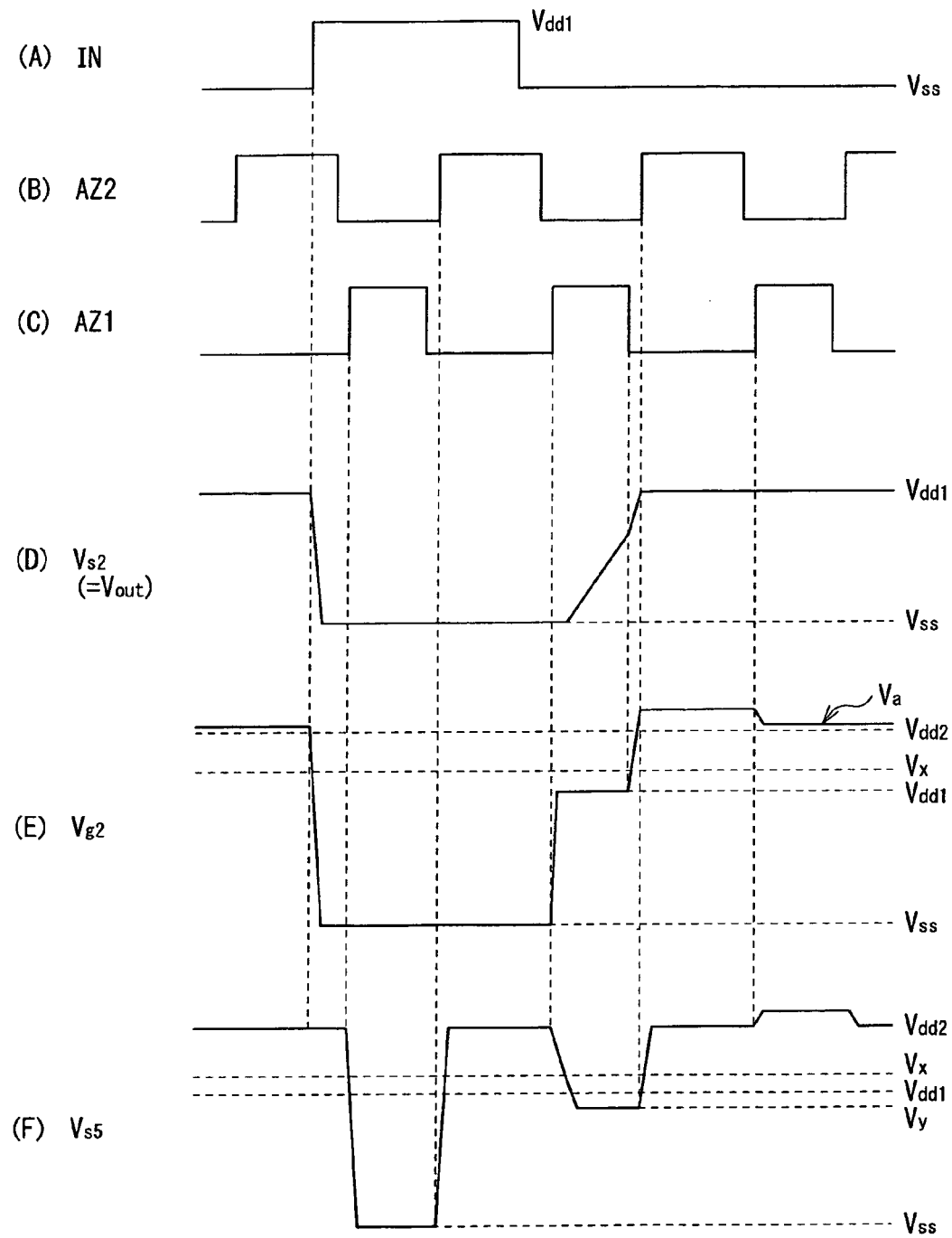
FIG. 13 is a waveform chart illustrating another example of the operation of the inverter circuit in FIG. 1.

In the above-described embodiment, for example, as illustrated in FIGS. 12 and 13, when a falling edge voltage is applied to the input terminal IN, the transistor $Tr_4$ may be turned off, and after the falling edge voltage is applied to the input terminal IN, the transistor $Tr_4$ may be turned on. In such a case, the voltage of the capacity element $C_1$ (the source voltage of the transistor $Tr_5$) is prevented from being reduced from the voltage $V_{dd2}$ by the transistor $Tr_3$. As a result, the inverter circuit 1 is allowed to be operated at high speed.

Figure 14:
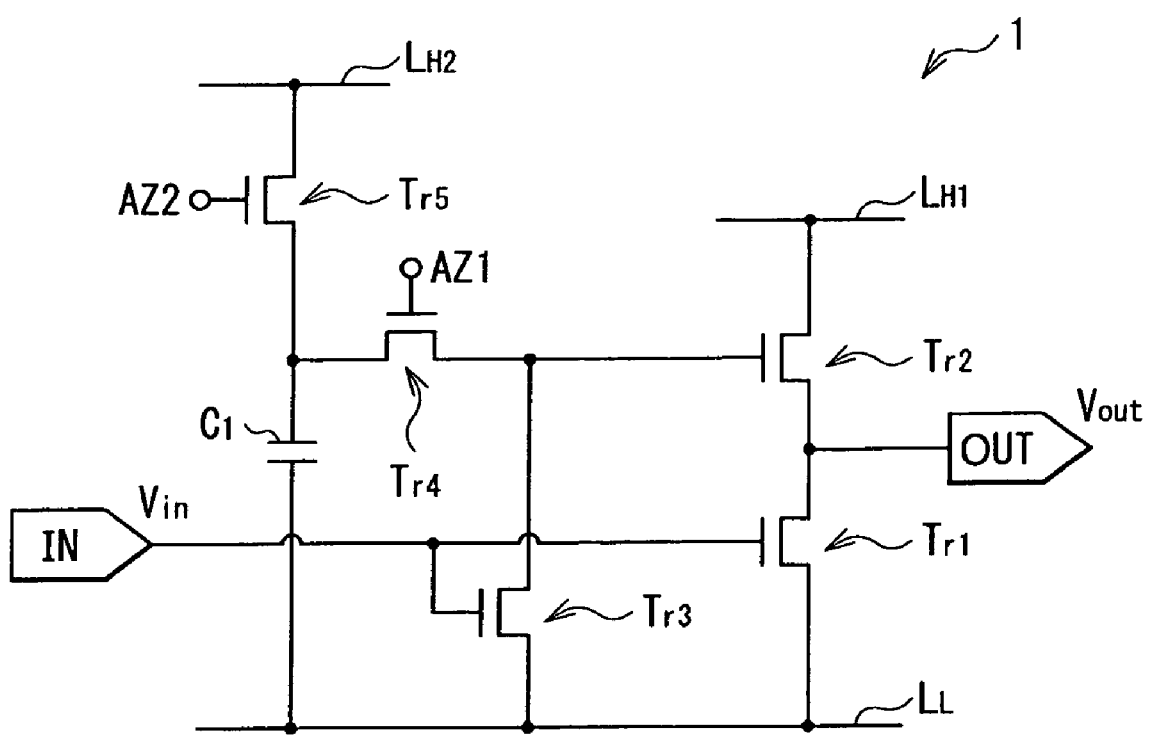
FIG. 14 is a circuit diagram illustrating a modification of the inverter circuit in FIG. 1.
Figure 15:
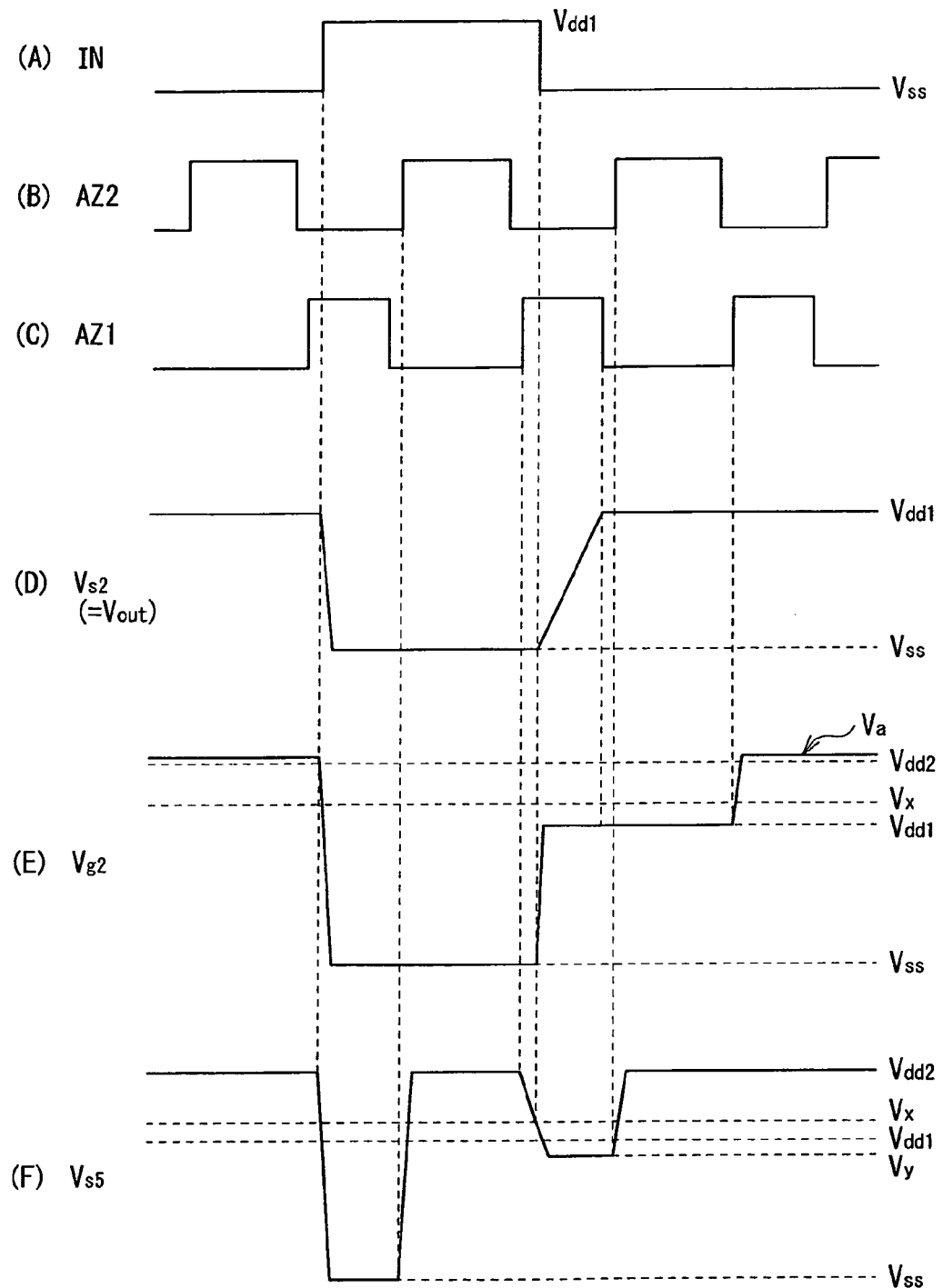
FIG. 15 is a waveform chart illustrating an example of an operation of the inverter circuit in FIG. 14.

Moreover, in the above-described embodiment and the modification thereof, for example, as illustrated in FIG. 14, the capacity element $C_2$ may be removed from the inverter circuit 1. In such a case, the gate voltage $V_y$ represented by the above-described expression (1) is allowed to be substantially equal to the voltage $V_x$ (refer to a part (E) in FIG. 15). Therefore, the inverter circuit 1 is allowed to be operated at higher speed.

Further, in the above-described embodiment and the modifications thereof, the transistors $Tr_1$ to $Tr_5$ are configured of n-channel MOS type TFTs; however, they may be configured of p-channel MOS type TFTs. In this case, a transient response when the transistors $Tr_1$ to $Tr_5$ are switched (increased) from low to high and a transient response when the transistors $Tr_1$ to $Tr_5$ are switched (reduced) from high to low are opposite to each other. Moreover, the high-voltage line $V_{H1}$ is replaced with a low-voltage line $L_{L1}$, and the high-voltage line $V_{H2}$ is replaced with a low-voltage line $L_{L2}$, and the low-voltage line $L_L$ is replaced with the high-voltage line $V_H$.

In this case, the low-voltage lines $L_{L1}$ and $L_{L2}$ are connected to a power supply (not illustrated) outputting a lower voltage (a constant voltage) than the voltage of the high-voltage line $V_H$. The voltage of the low-voltage line $L_{L1}$ is at a voltage $V_{ss1}$ during the drive of the inverter circuit, and the voltage of the low-voltage line $L_{L2}$ is at a voltage $V_{ss2}$ ($\leq V_{ss1} - V_{th2}$) during the drive of the inverter circuit. On the other hand, the high-voltage line $V_H$ is connected to a power supply (not illustrated) outputting a higher voltage (a constant voltage) than the voltages of the low-voltage lines $L_{L1}$ and $L_{L2}$, and the voltage of the high-voltage line $V_H$ is at the voltage $V_{dd}$ ($>V_{ss1}$) during the drive of the inverter circuit.

APPLICATION EXAMPLE

Figure 16:
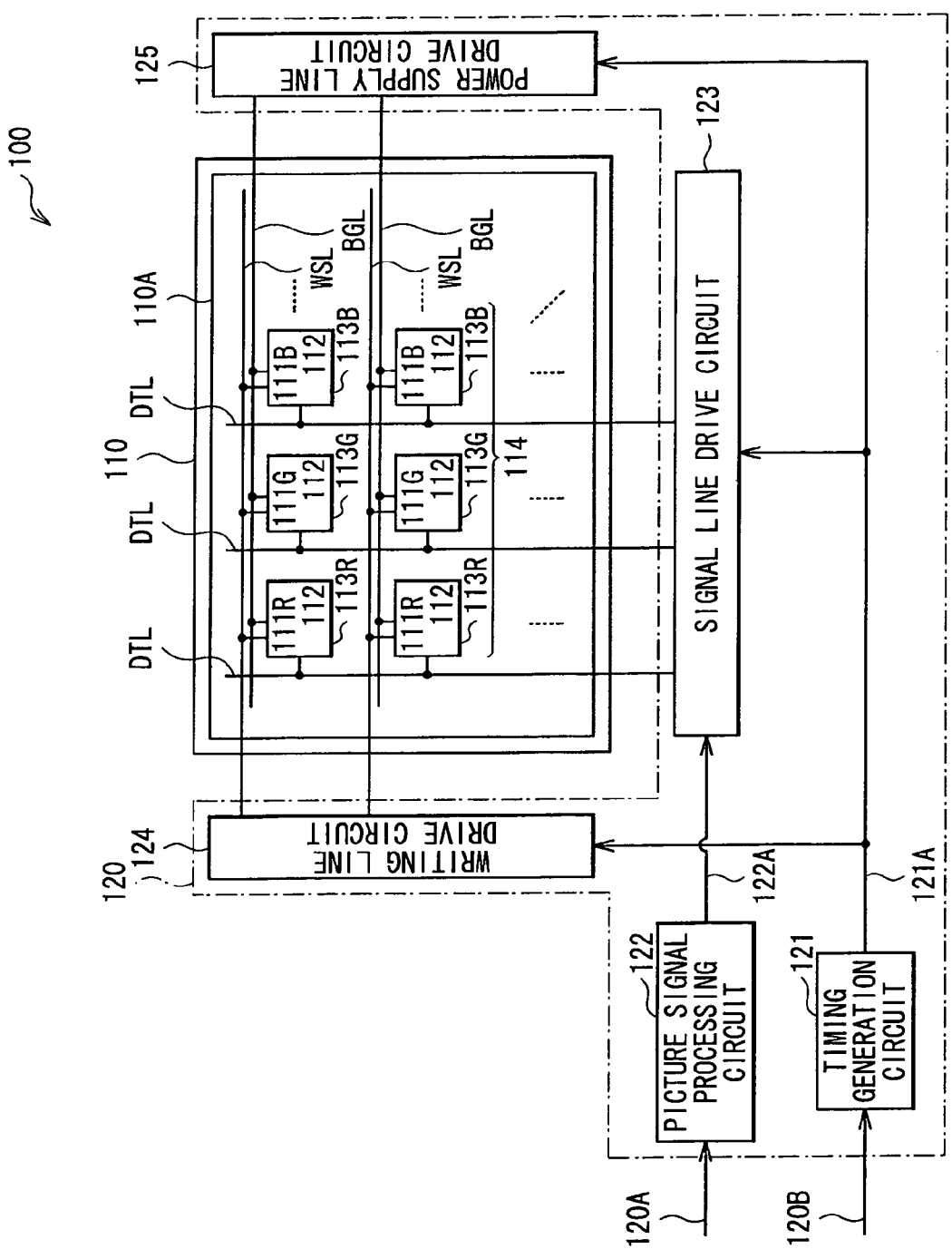
FIG. 16 is a schematic view of a display as an application example of the inverter circuit according to any of the above-described embodiment and modifications thereof.

FIG. 16 illustrates an example of a whole configuration of a display 100 as an application example of the inverter circuit 1 according to any of the above-described embodiment and the modifications thereof. The display 100 includes, for example, a display panel 110 (a display section) and a drive circuit 120 (a drive section).

Display Panel 110

The display panel 110 includes a display region 110A in which three kinds of organic EL elements 111R, 111G and 111B emitting light of different colors are two-dimensionally arranged. The display region 110A is a region where a picture is displayed with use of light emitted from the organic EL elements 111R, 111G and 111B. The organic EL element 111R is an organic EL element emitting red light, the organic EL element 111G is an organic EL element emitting green light, and the organic EL element 111B is an organic EL element emitting blue light. In addition, the organic EL elements 111R, 111G and 111B are collectively called organic EL elements 111 as necessary.

Display Region 110A

Figure 17:
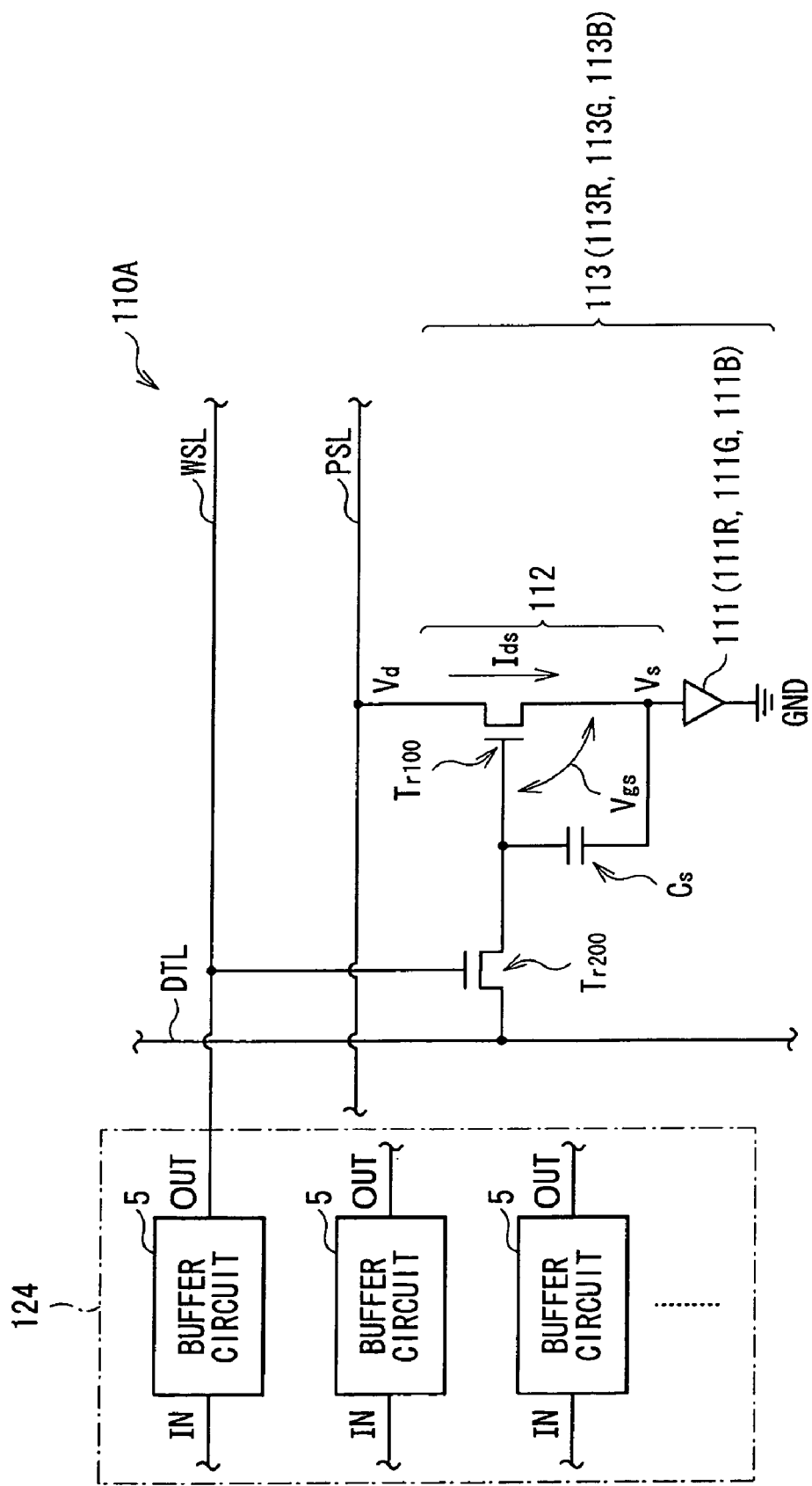
FIG. 17 is a circuit diagram illustrating an example of a writing line drive circuit and a pixel circuit in FIG. 16.

FIG. 17 illustrates an example of a circuit configuration in the display region 10A with an example of a writing line drive circuit 124 which will be described later. In the display region 110A, a plurality of pixel circuits 112 are two-dimensionally arranged so as to be paired with the organic EL elements 111, respectively. In the application example, a pair of the organic EL element 111 and the pixel circuit 112 configures one pixel 113. More specifically, as illustrated in FIG. 12, a pair of the organic EL element 111R and the pixel circuit 112 configures one red pixel 113R, and a pair of the organic EL element 111G and the pixel circuit 112 configures one green pixel 113G, and a pair of the organic EL element 111B and the pixel circuit 112 configures one blue pixel 113B. Moreover, three adjacent pixels 113R, 113G and 113B configure one display pixel 114.

Each pixel circuit 112 includes, for example, a driving transistor $Tr_{100}$ controlling a current flowing through the organic EL element 111, a writing transistor $Tr_{200}$ writing a voltage of a signal line DTL to the driving transistor $Tr_{100}$, and a retention capacitor Cs. In other words, each pixel circuit 112 has a 2Tr1C circuit configuration. The driving transistor $Tr_{100}$ and the writing transistor $Tr_{200}$ each are configured of, for example, an n-channel MOS type thin film transistor (TFT). The driving transistor $Tr_{100}$ or the writing transistor $Tr_{200}$ may be configured of, for example, a p-channel MOS type TFT.

In the display region 110A, a plurality of writing lines WSL (scanning lines) are arranged in rows, and a plurality of signal lines DTL are arranged in columns. In the display region 110A, a plurality of power supply lines PSL (members to which a power supply voltage is supplied) are arranged in rows along the writing lines WSL. One organic EL element 111 is arranged around an intersection of each of the signal lines DTL and each of the writing lines WSL. Each of the signal lines DTL is connected to an output end (not illustrated) of a signal line drive circuit 123 which will be described later and one of a drain electrode and a source electrode (both not illustrated) of the writing transistor $Tr_{200}$. Each of the writing lines WSL is connected to an output end (not illustrated) of a writing line drive circuit 124 which will be described later and a gate electrode (not illustrated) of the writing transistor $Tr_{200}$. Each of the power supply lines PSL is connected to an output end (not illustrated) of a power supply line drive circuit 125 which will be described later and one of a drain electrode and a source electrode (both not illustrated) of the driving transistor $Tr_{100}$. The other which is not connected to the signal line DTL of the drain electrode and the source electrode (both not illustrated) of the writing transistor $Tr_{200}$ is connected to a gate electrode (not illustrated) of the driving transistor $Tr_{100}$ and an end of the retention capacitor $C_s$. The other which is not connected to the power supply line PSL of the drain electrode and the source electrode (both not illustrated) of the driving transistor $Tr_{100}$ and the other end of retention capacitor $C_s$ are connected to an anode electrode (not illustrated) of the organic EL element 111. A cathode electrode (not illustrated) of the organic EL element 111 is connected to, for example, a ground line GND.

Drive Circuit 120

Next, each circuit in the drive circuit 120 will be described referring to FIGS. 16 and 17. The drive circuit 120 includes a timing generation circuit 121, a picture signal processing circuit 122, the signal line drive circuit 123, the writing line drive circuit 124 and the power supply line drive circuit 125.

The timing generation circuit 121 controls the picture signal processing circuit 122, the signal line drive circuit 123, the writing line drive circuit 124 and the power supply line drive circuit 125 to operate in conjunction with one another. The timing generation circuit 21 outputs a control signal 121A to each of the above-described circuits in response to (in synchronization with), for example, a synchronization signal 120B entered from outside.

The picture signal processing circuit 122 performs predetermined correction on the picture signal 120A entered from outside, and outputs a corrected picture signal 122A to the signal line drive circuit 123. Examples of the predetermined correction include gamma correction and overdrive correction.

The signal line drive circuit 123 applies the picture signal 122A (a signal voltage $V_{sig}$) entered from the picture signal processing circuit 122 to each of the signal lines DTL in response to (in synchronization with) the input of the control signal 121A so as to write the picture signal 122A to selected pixels 113. Note that writing means applying a predetermined voltage to a gate of the driving transistor $Tr_{100}$.

The signal line drive circuit 123 is configured by including, for example, a shift register (not illustrated), and includes buffer circuits (not illustrated) corresponding to columns of pixels 113, respectively. The signal line drive circuit 123 is allowed to output two kinds of voltages ($V_{ofs}$ and $V_{sig}$) to each of the signal lines DTL in response to (in synchronization with) the input of the control signal 121A. More specifically, the signal line drive circuit 123 sequentially supplies two kinds of voltages ($V_{ofs}$ and $V_{sig}$) to pixels 113 selected by the wiring line drive circuit 124 through the signal lines DTL connected to the pixels 113.

In this case, an offset voltage $V_{ofs}$ has a constant voltage value irrespective of the value of a signal voltage $V_{sig}$. Moreover, the signal voltage $V_{sig}$ has a voltage value corresponding to the picture signal 122A. The minimum voltage of the signal voltage $V_{sig}$ is lower than the offset voltage $V_{ofs}$, and the maximum voltage of the signal voltage $V_{sig}$ is higher than offset voltage $V_{ofs}$.

The writing line drive circuit 124 is configured by including, for example, a shift register (not illustrated), and includes buffer circuits 5 corresponding to rows of pixels 113, respectively. The buffer circuits 5 each are configured of a plurality of the above-described inverter circuits 1, and outputs a pulse signal with substantially the same phase as that of a pulse signal applied to an input end thereof to an output end thereof The writing line drive circuit 124 is allowed to output two kinds of voltages ($V_{dd1}$ and $V_{ss}$) to each of the wiring lines WSL in response to (in synchronization with) the input of the control signal 121A. More specifically, the writing line drive circuit 124 supplies two kinds of voltages ($V_{dd1}$ and $V_{ss}$) to pixels 113 to be driven through the writing lines WSL connected to the pixels 113 so as to control the writing transistor $Tr_{200}$.

In this case, the voltage $V_{dd1}$ has a value equal to or higher than an on-voltage of the writing transistor $Tr_{200}$. The voltage $V_{dd1}$ is a voltage value generated from the writing line drive circuit 124 during light extinction which will be described later or during threshold correction. The voltage $V_{ss}$ has a lower value than the on-voltage of the writing transistor $Tr_{200}$ and the voltage $V_{dd1}$.

The power supply line drive circuit 125 is configured by including, for example, a shift register (not illustrated), and includes buffer circuits (not illustrated) corresponding to the rows of the pixels 113, respectively. The power supply line drive circuit 125 is allowed to output two kinds of voltages ($V_{ccH}$ and $V_{ccL}$) in response to (in synchronization with) the input of the control signal 121A. More specifically, the power supply line drive circuit 125 supplies two kinds of voltages ($V_{ccH}$ and $V_{ccL}$) to pixels 113 to be driven through the power supply lines PSL connected to the pixels 113 to control light emission and extinction of the organic EL elements 11.

In this case, the voltage $V_{ccL}$ has a lower voltage value than a voltage ($V_{el}+V_{ca}$) which is the sum of a threshold voltage $V_{el}$ of the organic EL element 111 and a voltage $V_{ca}$ of a cathode of the organic EL element 111. Moreover, the voltage $V_{ccH}$ has a voltage value equal to or higher than the voltage ($V_{el}+V_{ca}$).

Next, an example of the operation (operation from light extinction to light emission) of the display 100 will be described below. In the application example, to maintain light emission luminance of the organic EL elements 111 constant even if the threshold voltage $V_{th}$ or the mobility μ of the driving transistor $Tr_{100}$ temporally changes, a correction operation on a change in the threshold voltage $V_{th}$ or the mobility μ is incorporated.

Figure 18:
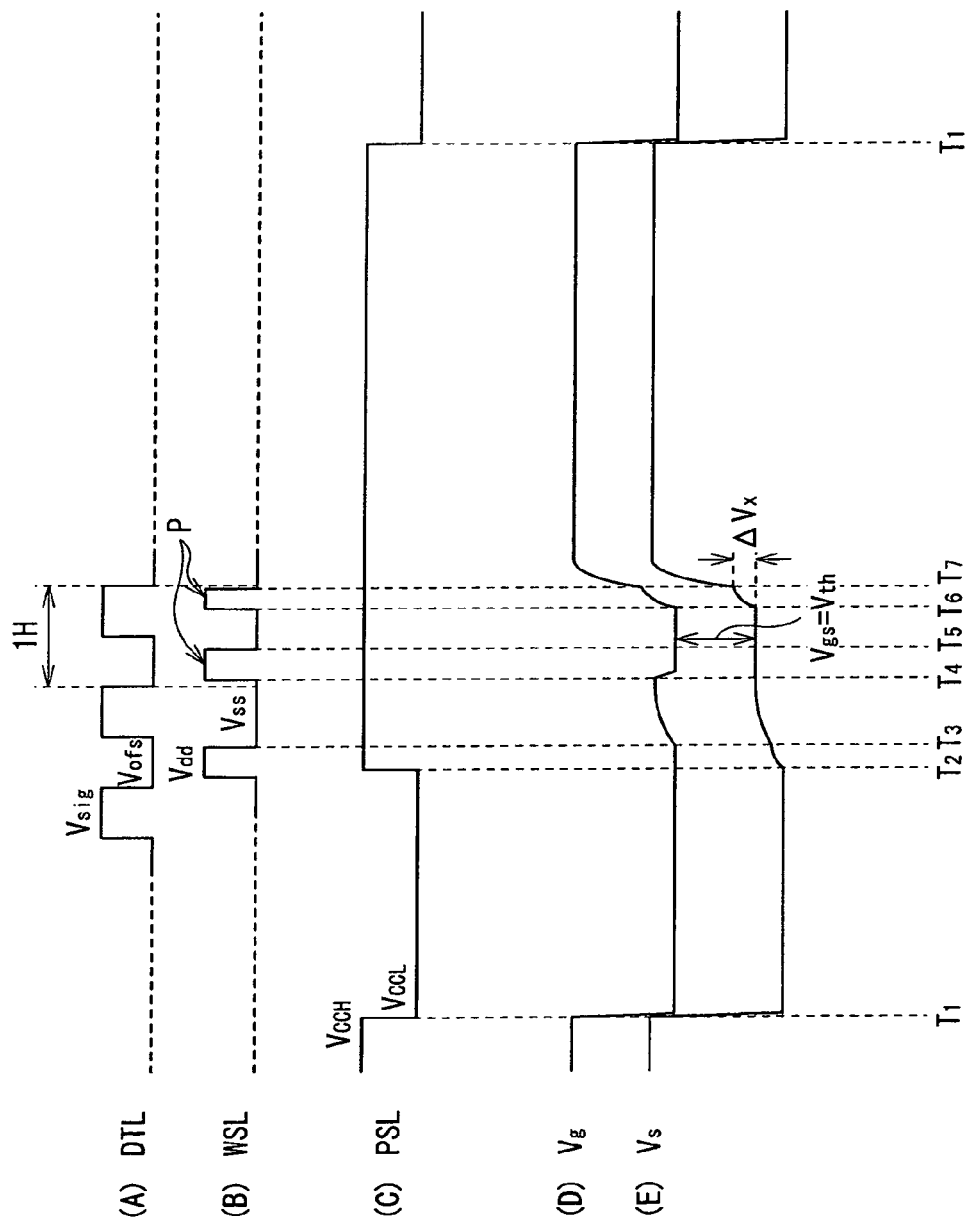
FIG. 18 is a waveform chart illustrating an example of an operation of the display in FIG. 16.
Figure 19:
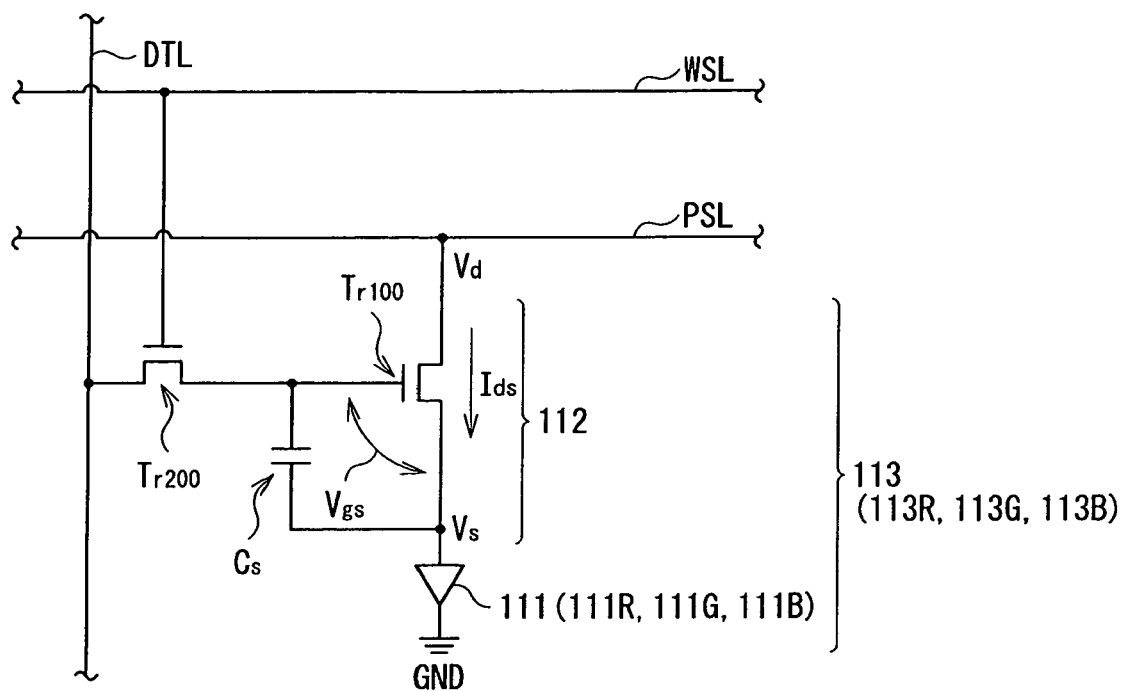
FIG. 19 is a circuit diagram illustrating an example of a pixel circuit of a display in related art.

FIG. 18 illustrates an example of voltage waveforms applied to the pixel circuit 112 and an example of changes in the gate voltage $V_g$ and the source voltage $V_s$ of the driving transistor $Tr_{100}$. A part (A) in FIG. 18 illustrates a state where the signal voltage $V_{sig}$ and the offset voltage $V_{ofs}$ are applied to the signal line DTL. A part (B) in FIG. 18 illustrates a state where the voltage $V_{dd}$ turning the writing transistor $Tr_{200}$ on and the voltage $V_{ss}$ turning the writing transistor $Tr_{200}$ off are applied to the writing line WSL. A part (C) in FIG. 18 illustrates a state where the voltage $V_{ccH}$ and the voltage $V_{ccL}$ are applied to the power supply line PSL. Moreover, parts (D) and (E) in FIG. 18 illustrate states where the gate voltage $V_g$ and the source voltage $V_s$ of the driving transistor $Tr_{100}$ are momentarily changed with the application of voltages to the power supply line PSL, the signal line DTL and the writing line WSL.

$V_{th}$ Correction Preparation Period

First, preparation for $V_{th}$ correction is made. More specifically, when the voltage of the writing line WSL is at the voltage $V_{off}$ and the voltage of the power supply line DSL is at the voltage $V_{ccH}$ (that is, when the organic EL element 111 emits light), the power source line drive circuit 125 reduces the voltage of the power source line DSL from the voltage $V_{ccH}$ to the voltage $V_{ccL}$ ($T_1$). Then, the source voltage $V_s$ is changed to the voltage $V_{ccL}$ to turn the organic EL element 111 off. After that, when the voltage of the signal line DTL is at the voltage $V_{ofs}$, the writing line drive circuit 124 increases the voltage of the writing line WSL from the voltage $V_{off}$ to the voltage $V_{on}$ to change the voltage of the gate of the driving transistor $Tr_{100}$ to the voltage $V_{ofs}$.

First $V_{th}$ Correction Period

Next, the $V_{th}$ correction is performed. More specifically, while the writing transistor $Tr_{200}$ is on and the voltage of the signal line DTL is at the voltage $V_{ofs}$, the power source line drive circuit 125 increases the voltage of the power source line DSL from the voltage $V_{ccL}$ to the voltage $V_{ccH}$ ($T_2$). Then, a current $I_{ds}$ flows between the drain and the source of the driving transistor $Tr_{100}$, and the source voltage $V_s$ is increased. After that, before the signal line drive circuit 123 switches the voltage of the signal line DTL from the voltage $V_{ofs}$ to the voltage $V_{sig}$, the writing line drive circuit 124 reduces the voltage of the writing line WSL from the voltage $V_{on}$ to the voltage $V_{off}$ ($T_3$). As a result, the gate of the driving transistor $Tr_{100}$ is turned to a floating state, and the $V_{th}$ correction stops.

First $V_{th}$ Correction Stop Period

During a period where the $V_{th}$ correction stops, sampling of the voltage of the signal line DTL is performed in a row (a pixel) different from a row (a pixel) on which the $V_{th}$ correction has already been performed. In addition, at this time, the source voltage $V_s$ is lower than a voltage $V_{ofs}-V_{th}$ in the row (the pixel) on which the $V_{th}$ correction has already been performed; therefore, during a $V_{th}$ correction stop period, the current $I_{ds}$ flows between the drain and the source of the driving transistor $Tr_{100}$ in the row (the pixel) on which the $V_{th}$ correction has already been performed, and the source voltage $V_s$ is increased, and the gate voltage $V_g$ is also increased by coupling through the retention capacitor $C_s$.

Second $V_{th}$ Correction Period

Next, the $V_{th}$ correction is performed again. More specifically, when the voltage of the signal line DTL is at the voltage $V_{ofs}$, thereby allowing the $V_{th}$ correction, the writing line drive circuit 124 increases the voltage of the writing line WSL from the voltage $V_{off}$ to the voltage $V_{on}$, and the gate of the driving transistor $Tr_{100}$ is changed to the voltage $V_{ofs}$ ($T_4$). At this time, in the case where the source voltage $V_s$ is lower than a voltage $V_{ofs}-V_{th}$ (in the case where the $V_{th}$ correction is not yet completed), the current $I_{ds}$ flows between the drain and the source of the driving transistor $Tr_{100}$ until cutting the driving transistor $Tr_{100}$ off (until the gate-source voltage $V_{gs}$ is changed to the voltage $V_{th}$). After that, before the signal line drive circuit 123 switches the voltage of the signal line DTL from the voltage $V_{ofs}$ to the voltage $V_{sig}$, the writing line drive circuit 24 reduces the voltage of the writing line WSL from the voltage $V_{on}$ to the voltage $V_{off}$ ($T_5$). Therefore, the gate of the driving transistor $Tr_{100}$ turns into a floating state, so the gate-source voltage $V_{gs}$ is allowed to be maintained constant irrespective of the magnitude of the voltage of the signal line DTL.

Note that in the $V_{th}$ correction period, in the case where the retention capacitor $C_s$ is charged to the voltage $V_{th}$ and the gate-source voltage $V_{gs}$ is changed to the voltage $V_{th}$, the drive circuit 120 completes the $V_{th}$ correction. However, in the case where the gate-source voltage $V_{gs}$ does not reach the voltage $V_{th}$, the drive circuit 120 repeatedly executes and stops the $V_{th}$ correction until the gate-source voltage $V_{gs}$ reaches the voltage $V_{th}$.

Writing μ Correction Period

After the $V_{th}$ correction stop period is completed, writing and μ correction are performed. More specifically, while the voltage of the signal line DTL is at the voltage $V_{sig}$, the writing line drive circuit 124 increases the voltage of the writing line WSL from the voltage $V_{off}$ to the voltage $V_{on}$ ($T_6$), and the gate of the driving transistor $Tr_{100}$ is connected to the signal line DTL. Therefore, the gate voltage $V_g$ of the driving transistor $Tr_{100}$ is changed to the voltage $V_{sig}$ of the signal line DTL. At this time, an anode voltage of the organic EL element 11 at this stage is still smaller than the threshold voltage $V_{el}$ of the organic EL element 111, so the organic EL element 111 is cut off. Therefore, the current $I_{ds}$ flows into an element capacitance (not illustrated) of the organic EL element 111, and the element capacitance is charged, so the source voltage $V_s$ is increased only by a voltage $\Delta V_y$, and then the gate-source voltage $V_{gs}$ reaches a voltage $V_{sig}+V_{th}-\Delta V_y$. Thus, μ correction is performed simultaneously with writing. In this case, the larger mobility μ of the driving transistor $Tr_{100}$ is, the more the voltage $\Delta V_y$ is increased, so when the gate-source voltage $V_{gs}$ is reduced only by the voltage $\Delta V_y$ before light emission, variations in mobility μ from one pixel circuit 113 to another are preventable.

Light Emission Period

Finally, the writing line drive circuit 124 reduces the voltage of the writing line WSL from the voltage $V_{on}$ to the voltage $V_{off}$ ($T_7$). Then, the gate of the driving transistor $Tr_{100}$ is turned into a floating state, and the current $I_{ds}$ flows between the drain and the source of the driving transistor $Tr_{100}$ to increase the source voltage $V_s$. As a result, a voltage equal to or higher than the threshold voltage $V_{el}$ is applied to the organic EL element 111, and the organic EL element 111 emits light with desired luminance.

In the display 100 in the application example, as described above, in each pixel 113, on/off control of the pixel circuit 112 is performed, and a drive current is thereby injected into the organic EL element 111 of each pixel 113 to cause emission of light by the recombination of holes and electrons, and then the light is extracted to outside. As a result, an image is displayed on the display region 110A of the display panel 110.

In the application example, for example, the buffer circuits 5 in the writing line drive circuit 124 each are configured of a plurality of the above-described inverter circuits 1. Therefore, a through current hardly flows through the buffer circuits 5; therefore, the power consumption of the buffer circuits 5 is allowed to be reduced. Moreover, variations in the output voltages of the buffer circuits 5 is small; therefore, variations in threshold correction or mobility correction of the driving transistor $Tr_{100}$ from one pixel circuit 112 to another are allowed to be reduced, and variations in luminance from one pixel 113 to another are allowed to be reduced.

Although the present invention is described referring to the embodiment, the modifications and the application example, the invention is not limited thereto, and may be variously modified.

For example, in the above-described application example, the inverter circuit 1 according to the above-described embodiment is used in an output stage of the writing line drive circuit 124; however, instead of the output stage of the writing line drive circuit 124, the inverter circuit 1 may be used in an output stage of the power supply line drive circuit 125, or may be used in both of the output stage of the writing line drive circuit 124 and the output stage of the power supply line drive circuit 125.

The present application contains subject matter related to that disclosed in Japanese Priority Patent Application JP 2010-084224 filed in the Japan Patent Office on Mar. 31, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An inverter circuit comprising:
a first transistor, a second transistor, a third transistor, a fourth transistor and a fifth transistor each having channels of same conduction type;
a first capacity element; and
an input terminal and an output terminal,
wherein the first transistor makes or breaks electrical connection between the output terminal and a first voltage line in response to a potential difference between a voltage of the input terminal and a voltage of the first voltage line or a potential difference corresponding thereto,
the second transistor makes or breaks electrical connection between a second voltage line and the output terminal in response to a potential difference between a voltage of a first terminal which is a source or a drain of the fourth transistor and a voltage of the output terminal or a potential difference corresponding thereto,
the third transistor makes or breaks electrical connection between the first terminal and a third voltage line in response to a potential difference between the voltage of the input terminal and a voltage of the third voltage line or a potential difference corresponding thereto,
the fourth transistor makes or breaks electrical connection between the first capacity element and a gate of the second transistor in response to a first control signal applied to a gate of the fourth transistor,
the fifth transistor makes or breaks electrical connection between the first capacity element and a fourth voltage line in response to a second control signal applied to a gate of the fifth transistor, and
the first capacity element is inserted between a source or a drain not connected to the fourth voltage line of the fifth transistor and a fifth voltage line.

2. An inverter circuit comprising:
a first transistor, a second transistor, a third transistor, a fourth transistor and a fifth transistor each having channels of same conduction type;
a first capacity element; and
an input terminal and an output terminal,
wherein a gate of the first transistor is electrically connected to the input terminal, and one terminal of a drain and a source of the first transistor is electrically connected to a first voltage line, and the other terminal of the first transistor is electrically connected to the output terminal,
one terminal of a drain and a source of the second transistor is electrically connected to a second voltage line, and the other terminal of the second transistor is electrically connected to the output terminal,
a gate of the third transistor is electrically connected to the input terminal, one terminal of a drain and a source of the third transistor is electrically connected to a third voltage line, and the other terminal of the third transistor is electrically connected to a gate of the second transistor, a gate of the fourth transistor is supplied with a first control signal, and one terminal of a drain and a source of the fourth transistor is electrically connected to the gate of the second transistor, a gate of the fifth transistor is supplied with a second control signal, one terminal of a drain and a source of the fifth transistor is electrically connected to a fourth voltage line, and the other terminal of the fifth transistor is electrically connected to the other terminal of the fourth transistor, and the first capacity element is inserted between the other terminal of the fifth transistor and a fifth voltage line.

3. The inverter circuit according to claim 2, further comprising:

a second capacity element inserted between the gate and the source of the second transistor.

4. The inverter circuit according to claim 3, wherein the capacity of the second capacity element is smaller than that of the first capacity element.

5. The inverter circuit according to claim 4, wherein the capacities of the first capacity element and the second capacity element satisfy the following expression:

$$C_1(V_{dd2}-V_{ss})/(C_1+C_2) > V_{th2}$$

where $C_1$ is the capacity of the first capacity element, $C_2$ is the capacity of the second capacity element, $V_{dd2}$ is a voltage of the fourth voltage line, $V_{ss}$ is a voltage of the first voltage line, and $V_{th2}$ is a threshold voltage of the second transistor.

6. The inverter circuit according to claim 2, wherein the first voltage line, the third voltage line and the fifth voltage line have the same potential.

7. The inverter circuit according to claim 6, wherein the second voltage line and the fourth voltage line are connected to a power supply outputting a voltage higher than a common voltage of the first voltage line, the third voltage line and the fifth voltage line.

8. The inverter circuit according to claim 7, wherein the fourth voltage line is connected to a power supply outputting a voltage higher than the voltage of the second voltage line by a threshold voltage of the second transistor or over.

9. The inverter circuit according to claim 2, wherein the fourth transistor and the fifth transistor are alternately turned on and off so as not to be turned on simultaneously.

10. The inverter circuit according to claim 9, wherein the fourth transistor is turned on before a voltage of the input terminal falls.

11. The inverter circuit according to claim 9, wherein the fourth transistor is turned on after a voltage of the input terminal falls.

12. A display with a display section and a drive section, the display section including a plurality of scanning lines arranged in rows, a plurality of signal lines arranged in columns, and a plurality of pixels arranged in a matrix form, the drive section including a plurality of inverter circuits each arranged corresponding to the scanning lines to drive each of the pixels, each of the inverter circuits comprising:

a first transistor, a second transistor, a third transistor, a fourth transistor and a fifth transistor each having channels of same conduction type;

a first capacity element; and an input terminal and an output terminal, wherein the first transistor makes or breaks electrical connection between the output terminal and a first voltage line in response to a potential difference between a voltage of the input terminal and a voltage of the first voltage line or a potential difference corresponding thereto, the second transistor makes or breaks electrical connection between a second voltage line and the output terminal in response to a potential difference between a voltage of a first terminal which is a source or a drain of the fourth transistor and a voltage of the output terminal or a potential difference corresponding thereto, the third transistor makes or breaks electrical connection between the first terminal and a third voltage line in response to a potential difference between the voltage of the input terminal and a voltage of the third voltage line or a potential difference corresponding thereto, the fourth transistor makes or breaks electrical connection between the first capacity element and a gate of the second transistor in response to a first control signal applied to a gate of the fourth transistor, the fifth transistor makes or breaks electrical connection between the first capacity element and a fourth voltage line in response to a second control signal applied to a gate of the fifth transistor, and the first capacity element is inserted between a source or a drain not connected to the fourth voltage line of the fifth transistor and a fifth voltage line.

13. A display with a display section and a drive section, the display section including a plurality of scanning lines arranged in rows, a plurality of signal lines arranged in columns, and a plurality of pixels arranged in a matrix form, the drive section including a plurality of inverter circuits each arranged corresponding to the scanning lines to drive each of the pixels, each of the inverter circuits comprising:

a first transistor, a second transistor, a third transistor, a fourth transistor and a fifth transistor each having channels of same conduction type;

a first capacity element; and an input terminal and an output terminal, wherein a gate of the first transistor is electrically connected to the input terminal, and one terminal of a drain and a source of the first transistor is electrically connected to a first voltage line, and the other terminal of the first transistor is electrically connected to the output terminal, one terminal of a drain and a source of the second transistor is electrically connected to a second voltage line, and the other terminal of the second transistor is electrically connected to the output terminal, a gate of the third transistor is electrically connected to the input terminal, one terminal of a drain and a source of the third transistor is electrically connected to a third voltage line, and the other terminal of the third transistor is electrically connected to a gate of the second transistor, a gate of the fourth transistor is supplied with a first control signal, and one terminal of a drain and a source of the fourth transistor is electrically connected to the gate of the second transistor, a gate of the fifth transistor is supplied with a second control signal, one terminal of a drain and a source of the fifth transistor is electrically connected to a fourth voltage line, and the other terminal of the fifth transistor is electrically connected to the other terminal of the fourth transistor, and the first capacity element is inserted between the other terminal of the fifth transistor and a fifth voltage line.

* * * * *